(12) United States Patent
Kuo et al.

(10) Patent No.: US 11,735,577 B2
(45) Date of Patent: Aug. 22, 2023

(54) METHOD FOR FABRICATING SEMICONDUCTOR STRUCTURE WITH STRENGTHENED PATTERNS

(71) Applicant: NANYA TECHNOLOGY CORPORATION, New Taipei (TW)

(72) Inventors: Ching-Yuan Kuo, Taoyuan (TW); Chih-Hao Kuo, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/524,907

(22) Filed: Nov. 12, 2021

(65) Prior Publication Data

US 2022/0077136 A1 Mar. 10, 2022

Related U.S. Application Data

(62) Division of application No. 17/000,921, filed on Aug. 24, 2020, now Pat. No. 11,373,992.

(51) Int. Cl.
*H01L 27/02* (2006.01)
*H01L 21/033* (2006.01)
(Continued)

(52) U.S. Cl.
CPC ...... *H01L 27/0207* (2013.01); *H01L 21/0274* (2013.01); *H01L 21/0334* (2013.01); *H01L 21/3086* (2013.01); *H01L 21/3088* (2013.01)

(58) Field of Classification Search
CPC .................................................. H01L 27/0207
See application file for complete search history.

(56) References Cited

U.S. PATENT DOCUMENTS

| 10,395,976 B1 * | 8/2019 | Shih | H01L 21/32139 |
| 2013/0341801 A1 * | 12/2013 | Satoh | H01L 27/222 |
| | | | 257/E21.585 |

(Continued)

FOREIGN PATENT DOCUMENTS

| TW | 201931437 A | 8/2019 |
| TW | 201947661 A | 12/2019 |

OTHER PUBLICATIONS

Office Action dated Jul. 4, 2022 related to Taiwanese Application No. 110124057.

(Continued)

*Primary Examiner* — Walter H Swanson
(74) *Attorney, Agent, or Firm* — Xuan Zhang

(57) ABSTRACT

The disclosure provides a method for fabricating a semiconductor structure with strengthened patterns. The method includes forming a masking layer on the substrate, the masking layer including a peripheral region and an array region adjacent to the peripheral region; forming a first etched peripheral pattern in the peripheral region and a first etched array pattern in the array region, wherein the first etched peripheral pattern and the first etched array pattern have a top surface, a sidewall and a bottom surface, the sidewall connecting the top surface to the bottom surface; forming a second peripheral pattern on the first etched peripheral pattern and forming a second array pattern on the first etched array pattern; and etching the masking layer using the first etched peripheral pattern and the second peripheral pattern as an etching mask to form an etched masking layer in the peripheral region.

14 Claims, 25 Drawing Sheets

(51) Int. Cl.
  *H01L 21/027* (2006.01)
  *H01L 21/308* (2006.01)

(56) References Cited

U.S. PATENT DOCUMENTS

2020/0066648 A1* 2/2020 Chen ................ H01L 21/31144
2020/0168457 A1* 5/2020 Shih .................... H01L 21/0337

OTHER PUBLICATIONS

Summary translation of Office Action dated Jul. 4, 2022 related to Taiwanese Application No. 110124057.

* cited by examiner

METHOD FOR FABRICATING SEMICONDUCTOR STRUCTURE WITH STRENGTHENED PATTERNS

CROSS-REFERENCE TO RELATED APPLICATION

This application is a divisional application of U.S. Non-Provisional application Ser. No. 17/000,921 filed on Aug. 24, 2020, which is incorporated herein by reference in its entirety.

TECHNICAL FIELD

The present disclosure relates to a method for fabricating a semiconductor structure, and more particularly, to a method for fabricating a semiconductor structure with strengthened patterns.

DISCUSSION OF THE BACKGROUND

Semiconductor devices are essential for many modern applications. With the advancement of electronic technology, semiconductor structures are becoming smaller in size while providing greater functionality and comprising greater amounts of integrated circuitry (IC).

Lithography is a process that uses photoresist as a mask to create patterned structures. Therefore, the robustness of photoresist is of great importance to pattern definition. As advancing technology drives continuous size reduction, various technical problems arise. For example, some semiconductor structures cannot be successfully formed because of their miniaturized size, and some semiconductor structures suffer from defects, e.g., photoresists that are difficult to remove.

Thus, there is a need to improve the semiconductor manufacturing process, particularly the lithography process.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor structure. The method comprises providing a substrate; forming a masking layer on the substrate, the masking layer including a peripheral region and an array region adjacent to the peripheral region; forming a first etched peripheral pattern in the peripheral region and a first etched array pattern in the array region, wherein the first etched peripheral pattern and the first etched array pattern have a top surface, a sidewall and a bottom surface, the sidewall connecting the top surface to the bottom surface; forming a second peripheral pattern on the first etched peripheral pattern and forming a second array pattern on the first etched array pattern; and etching the masking layer using the first etched peripheral pattern and the second peripheral pattern as an etching mask to form an etched masking layer in the peripheral region.

In some embodiments, the substrate comprises a metal layer.

In some embodiments, the masking layer comprises a nitride layer.

In some embodiments, the forming the first etched peripheral pattern and the first etched array pattern includes: forming a first photoresist layer on the masking layer; and exposing the first photoresist layer to ultraviolet radiation via a first photo mask, wherein the first photo mask comprises a first transparent portion and a first opaque portion corresponding to the first etched peripheral pattern and the first etched array pattern.

In some embodiments, after the first photoresist layer is exposed to ultraviolet radiation, a developing process is performed to form a first pattern.

In some embodiments, the first pattern comprises a first peripheral pattern in the peripheral region and a first array pattern in the array region.

In some embodiments, after the developing process is performed, an etching process is performed using the first pattern as an etching mask to form the first etched peripheral pattern and the first etched array pattern.

In some embodiments, the forming the second peripheral pattern and the second array pattern includes: forming a second photoresist layer on the first etched peripheral pattern and on the first etched array pattern; and exposing the second photoresist layer to ultraviolet radiation via a second photo mask, wherein the second photo mask comprises a second transparent portion and a second opaque portion corresponding to the second peripheral pattern.

In some embodiments, the forming the second photoresist layer includes covering the first etched peripheral pattern and the first etched array pattern with the second photoresist layer.

In some embodiments, after the second photoresist layer is exposed to ultraviolet radiation, a developing process is performed to form the second peripheral pattern and the second array pattern.

In some embodiments, the second peripheral pattern is formed on the bottom surface and separated from the sidewall of the first etched peripheral pattern in the peripheral region.

In some embodiments, the second array pattern covers the top surface and the bottom surface of the first etched array pattern in the array region.

In some embodiments, a first pitch of the first etched peripheral pattern is different from a second pitch of the first etched array pattern.

In some embodiments, a first height of the second peripheral pattern is greater than a second height of the first etched peripheral pattern.

Another aspect of the present disclosure provides a semiconductor structure. The semiconductor structure comprises a substrate including a peripheral region and an array region adjacent to the peripheral region. A first etched pattern is on the substrate, wherein the first etched pattern includes a first etched peripheral pattern and a first etched array pattern, the first etched peripheral pattern and the first etched array pattern having a top surface, a sidewall and a bottom surface, the sidewall connecting the top surface to the bottom surface. A second peripheral pattern is formed in the peripheral region. A second array pattern is formed in the array region.

In some embodiments, the second peripheral pattern is formed on the bottom surface and separated from the sidewall of the first etched peripheral pattern.

In some embodiments, the second array pattern covers the top surface and the bottom surface of the first etched array pattern.

In some embodiments, the substrate comprises a metal layer.

In some embodiments, a first pitch of the first etched peripheral pattern is different from a second pitch of the first etched array pattern.

In some embodiments, a first height of the second peripheral pattern is greater than a second height of the first etched peripheral pattern.

With the above-mentioned method for fabricating a semiconductor structure and the configuration of the semiconductor, array patterns are formed during fabrication of peripheral patterns on the metal zero (M0) layer. The fabrication of an M0 layer includes two separate processes, a peripheral region process and an array region process. The array patterns formed in the peripheral region process are not intended to define profiles in the layers thereunder; instead, the array patterns serve to reduce the flow rate of developing agents. As a result, the peripheral patterns are more durable and are able to resist removal by developing agents. Accordingly, during the peripheral region process, peripheral patterns do not collapse after being exposed to developing agents. Moreover, the photoresist coverage of patterns in the array region is not excessive, so there is less loading effect during the etch processes and no hard mask remains after the hard mask strip process. In conclusion, the formation of the array patterns contributes to formation of robust peripheral patterns.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
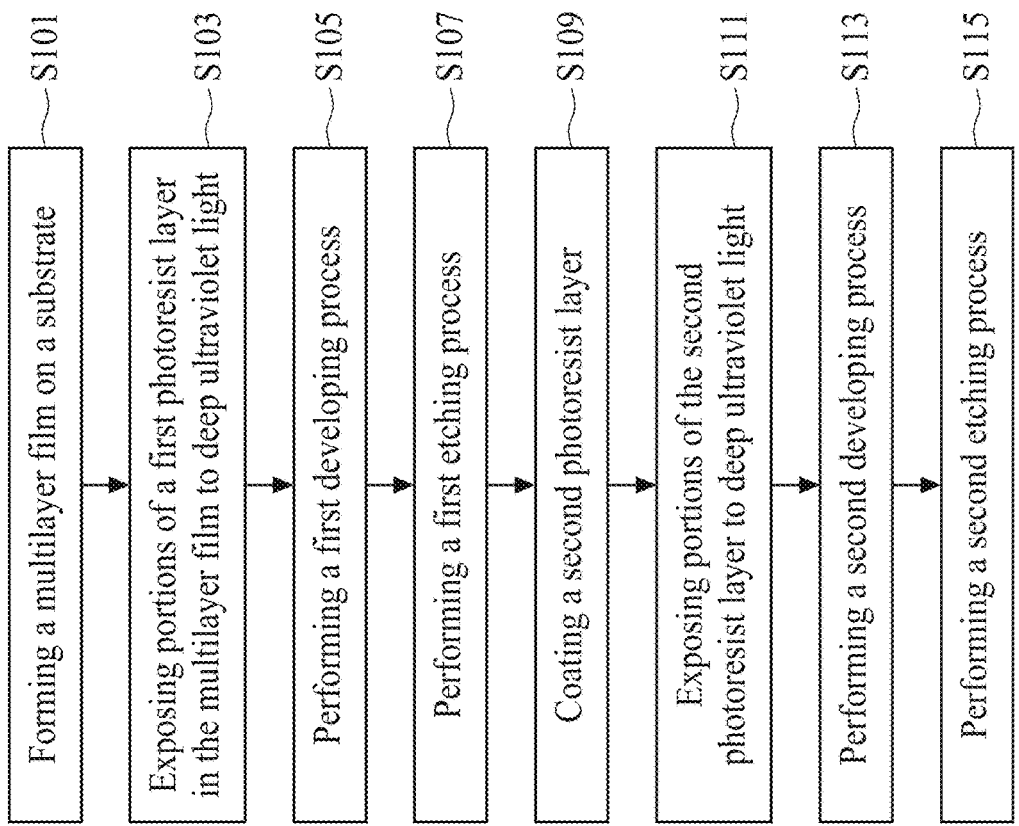
FIG. 1 is a representative flow diagram illustrating a peripheral region process for fabricating a semiconductor structure according to a first comparative embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist or a hard mask. In some embodiments, a patterning process is adopted to form a patterned layer directly on a surface. The patterning process includes forming a photosensitive film on the surface, conducting a lithography process, and performing a developing process. The remaining photosensitive film is retained and integrated into the semiconductor device.

In an advanced technology, process windows require more concerns. The array region and the peripheral region in a DRAM cell have different pattern densities and serve different functions after the DRAM cell finishes its production process. Therefore, the process windows between the array region and the peripheral region vary significantly. Normally, their respective circuit patterns may not be formed at the same time.

The metal zero (M0) layer is a critical layer because it is connected to multiple subsequent interconnect structures. In some embodiments, the fabrication of an M0 layer includes two separate processes, a peripheral region process and an array region process. The peripheral region process is used to form patterns in the peripheral region of a DRAM cell. The array region process is used to form patterns in the array region of a DRAM cell. In some embodiments, the peripheral region process is executed before the array region process. The peripheral region process includes four stages: a first lithography stage (PH1), a first etch stage (ET1), a second lithography stage (PH2) and a second etch stage (ET2). Accordingly, the foregoing peripheral region process uses a double patterning technology (DPT) or a Litho-Etch-Litho-Etch (LELE) technique, which requires the use of two photo masks in a single layer. In some other embodiments, the array region process can also be performed using an LELE technique.

Figure 2:
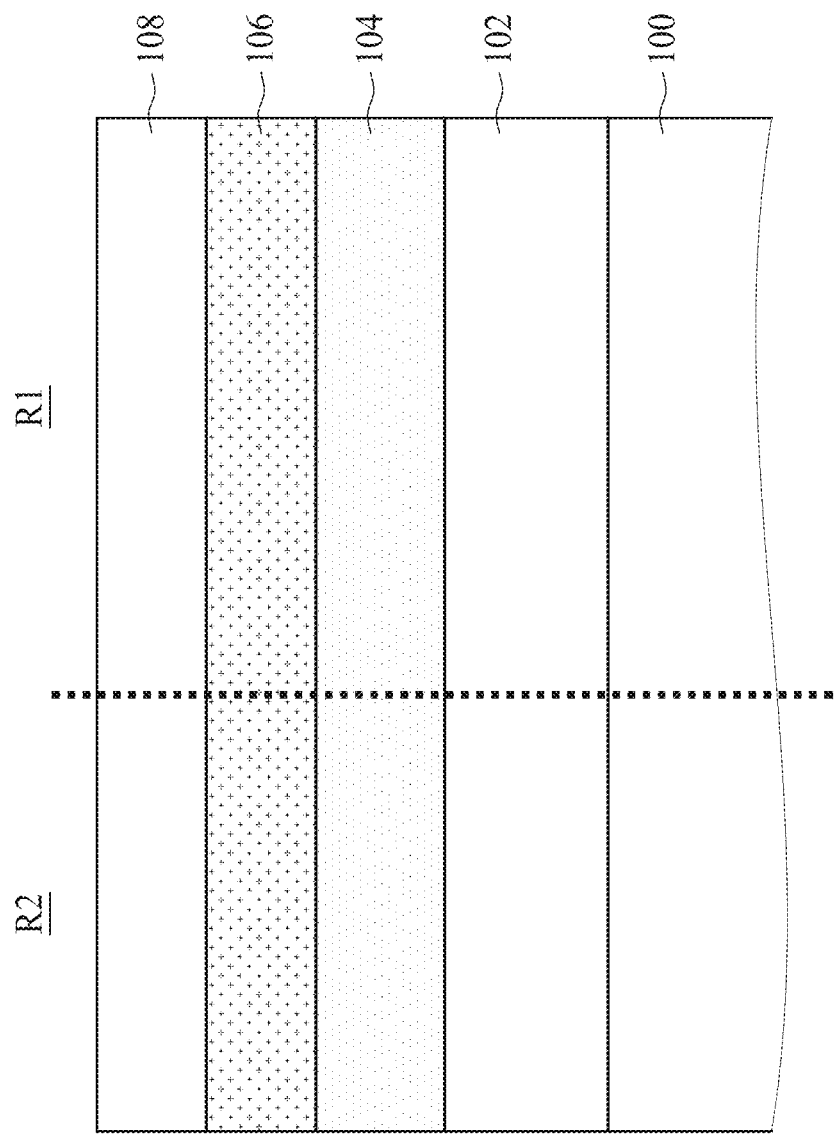
FIG. 2 is a schematic cross-sectional view showing the semiconductor structure after the performing of step 101 in FIG. 1.

FIG. 1 is a representative flow diagram illustrating a peripheral region process 10 for fabricating a semiconductor structure according to a first comparative embodiment of the present disclosure. FIG. 2 is a schematic cross-sectional view showing the semiconductor structure of FIG. 1, after step S101 is performed. As shown in FIG. 2, a substrate 100 is provided. In some embodiments, the substrate 100 includes a metal layer. A masking layer 102 is then deposited on the substrate 100. In some embodiments, the masking layer 102 includes a nitride layer. Subsequently, a multilayer resist (MLR) layer 104 is deposited on the masking layer 102. The MLR layer 104 is a combination of various films and is used to define patterns on the substrate 100. Subsequently, a hard mask layer 106 is formed on the MLR layer 104. Finally, a first photoresist layer 108 is coated on the hard mask layer 106. The masking layer 102, the MLR layer 104, the hard mask layer 106 and the first photoresist layer 108 together form a multilayer film on the substrate 100. The vertical dashed line in FIG. 2 indicates a boundary between a peripheral region R1 and an array region R2 in a DRAM cell. In some embodiments, the peripheral region R1 and the array region R2 include the same multilayer film combination.

In step S103, the first photoresist layer 108 is exposed to deep ultraviolet (DUV) light using a first photo mask. Because the peripheral region process 10 is used to form patterns in the peripheral region R1, the layout in the first photo mask only corresponds to the peripheral region R1. In fact, in the first comparative embodiment, the array region R2 is not exposed to DUV light at all. Therefore, after a first development is performed in step S105, the array region R2 is occupied by a photoresist bulk, whereas a plurality of first photoresist patterns are formed in the peripheral region R1.

Figure 3:
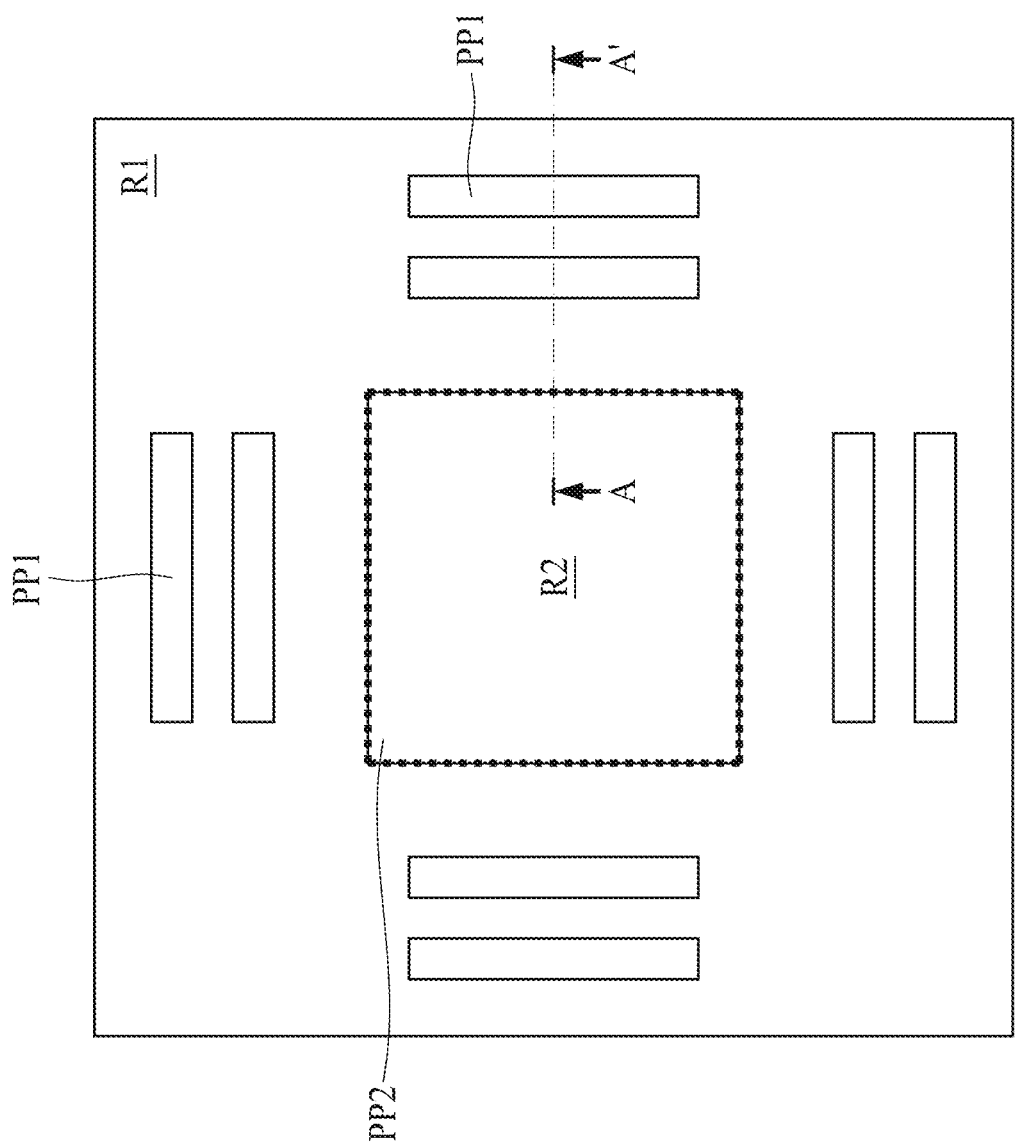
FIG. 3 is an illustrative top view showing the semiconductor structure during an intermediate stage in the fabrication of peripheral patterns according to a first comparative embodiment.

FIG. 3 is an illustrative top view depicting the semiconductor structure after step S105 is performed. As indicated by the square dashed line, the area enclosed in the array region R2 includes a photoresist bulk PP2. The horizontal and vertical lines in the peripheral region R1 indicate first photoresist patterns PP1.

Figure 4:
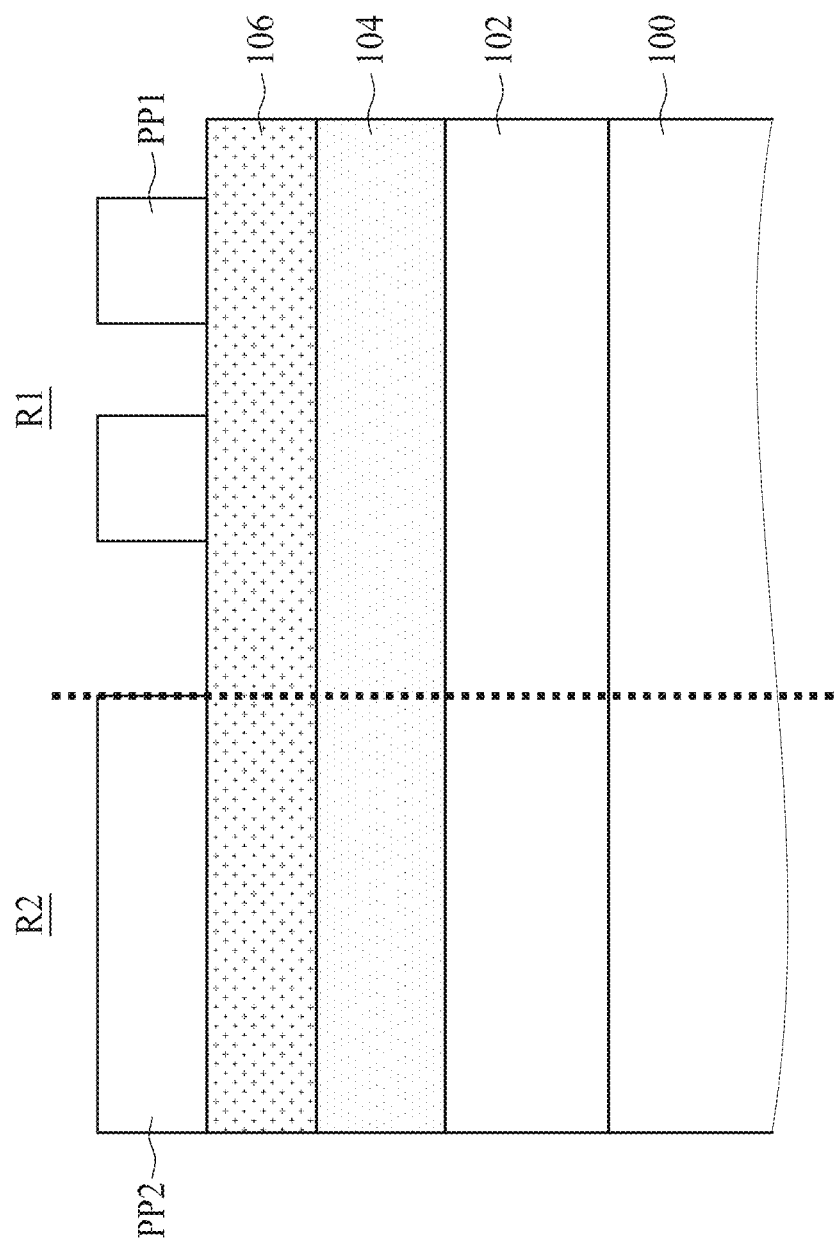
FIG. 4 is a schematic cross-sectional view of the semiconductor structure of FIG. 3 according to the first comparative embodiment.

FIG. 4 is a schematic cross-sectional view taken along the dashed line A-A' in FIG. 3. The photoresist bulk PP2 and the first photoresist patterns PP1 are formed and respectively located in different regions. In steps S107 to S115, the first photoresist patterns PP1 undergo subsequent processing to transfer their profiles to the layers below, while the photoresist bulk PP2 is not used for any pattern definition in the peripheral region process 10.

Referring back to FIG. 1, in step S109, the array region R2 is again coated with photoresist. In steps S111 and 113, the photoresist accumulated in the array region R2 is neither exposed nor developed. As a result, an accumulation of photoresist in the array region R2 causes a heavy load in a photoresist strip process performed after step S115. The heavy photoresist in the array region R2 prevents a complete photoresist lift-off, resulting in difficulty of hard mask strip. A frequent problem is that after the peripheral region process 10 is finished, the hard mask layer 106 in the array region R2 cannot be completely removed due to photoresist remaining on the top of the hard mask layer 106.

Figure 5:
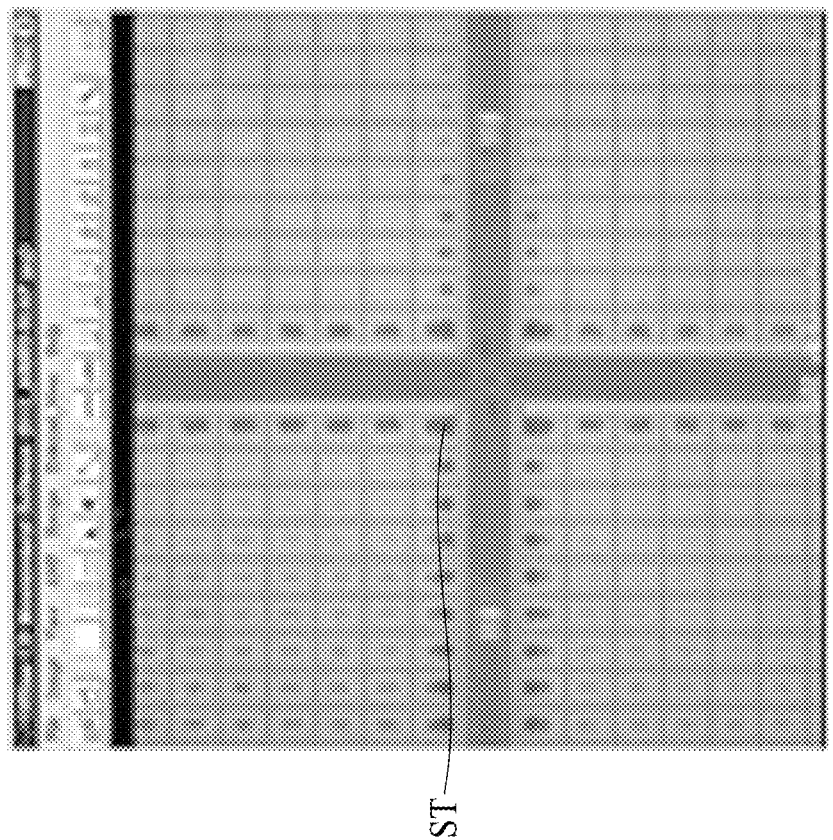
FIG. 5 is an optical microscope (OM) image of DRAM cells near a scribe line, according to an embodiment.

FIG. 5 is an optical microscope (OM) image. The cross-shaped region indicates scribe lines on the wafer. The multiple rectangular blocks are DRAM cells. Each cell has an array region R2 in the center and a peripheral region R1 surrounding the array region R2. As can be seen in the center of multiple cells, a stain ST remains in the array region R2. Cells near the scribe line have more stains, which means a more serious hard mask remains on the cells.

Figure 6:
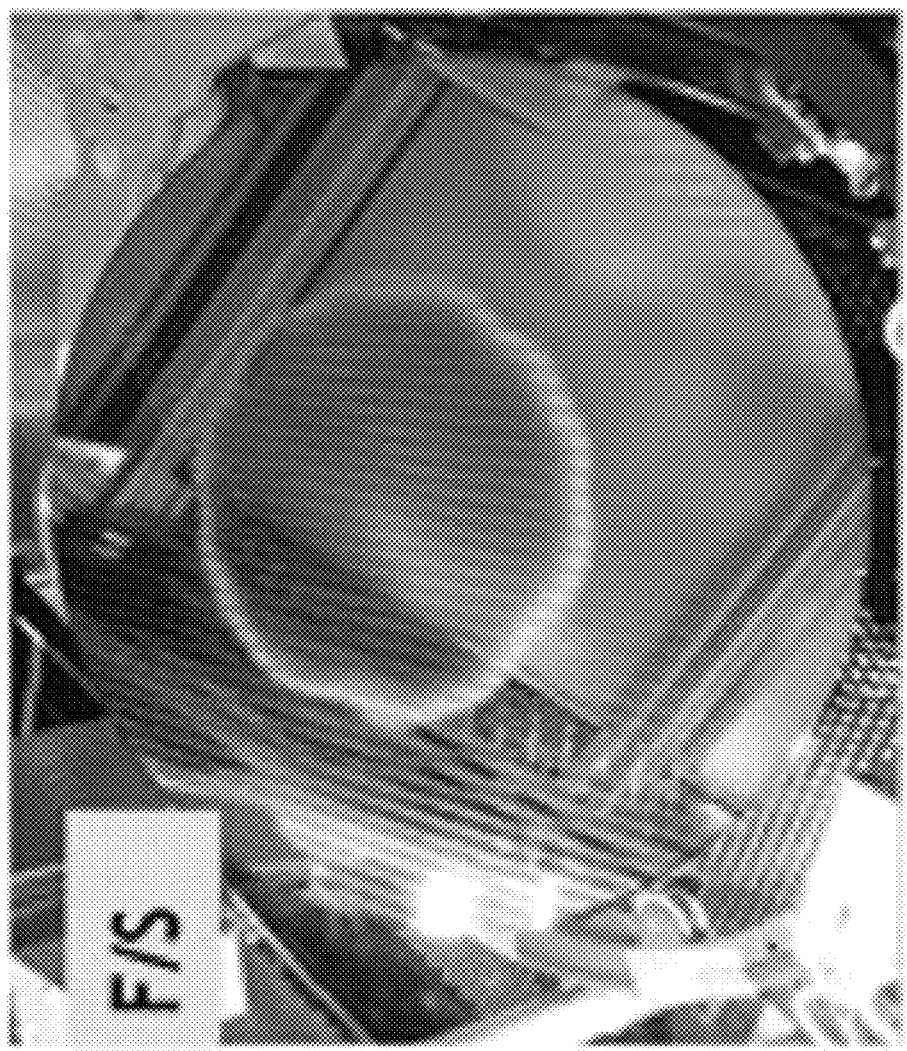
FIG. 6 is a picture showing a wafer after a hard mask lift-off process, according to an embodiment.

FIG. 6 is a photograph showing the wafer after the hard mask strip process. The stain in the center of the wafer occurs due to the hard mask remaining on multiple cells.

In a second comparative embodiment of the present disclosure, the peripheral region process is similar to that of the first comparative embodiment. As with the first comparative embodiment, the second comparative embodiment is also illustrated in the flow diagram in FIG. 1, with the only difference being a different layout of the first photo mask formed in step S103. All the other steps are identical to those in the first comparative embodiment. In the second comparative embodiment, the array region R2 is completely exposed to DUV light. Therefore, after step S105, the array region R2 is not covered by any photoresist.

Figure 7:
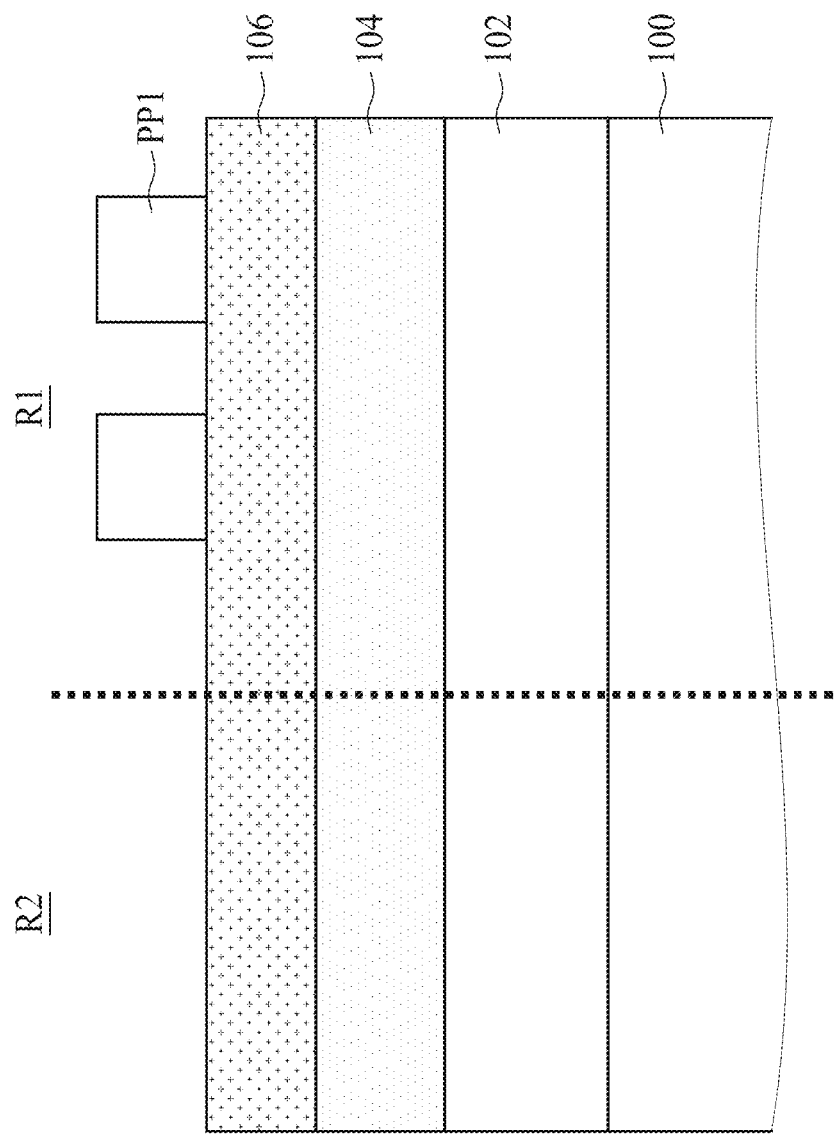
FIG. 7 is a schematic cross-sectional view showing a semiconductor structure during an intermediate stage of the fabrication of peripheral patterns according to a second comparative embodiment.

FIG. 7 is a schematic cross-sectional view showing an intermediate stage in the fabrication of a semiconductor structure according to the second comparative embodiment. The array region R2 is free of any photoresist, whereas the peripheral region R1 has a plurality of first photoresist patterns PP1 located on the hard mask layer 106. In the second comparative embodiment, the photoresist does not accumulate in the array region R2. Therefore, the etch load of the array region R2 is not as heavy as that in the first comparative embodiment, thereby improving the hard mask remaining problem described in reference to the first comparative embodiment.

However, the process in the second comparative embodiment may not work successfully, especially with a shrinking technology node. As the line width becomes narrower, photoresist lines become more fragile. Specifically, in the first lithography stage (PH1), first photoresist patterns PP1 collapse after the first development process is performed (step S105).

Figure 8:
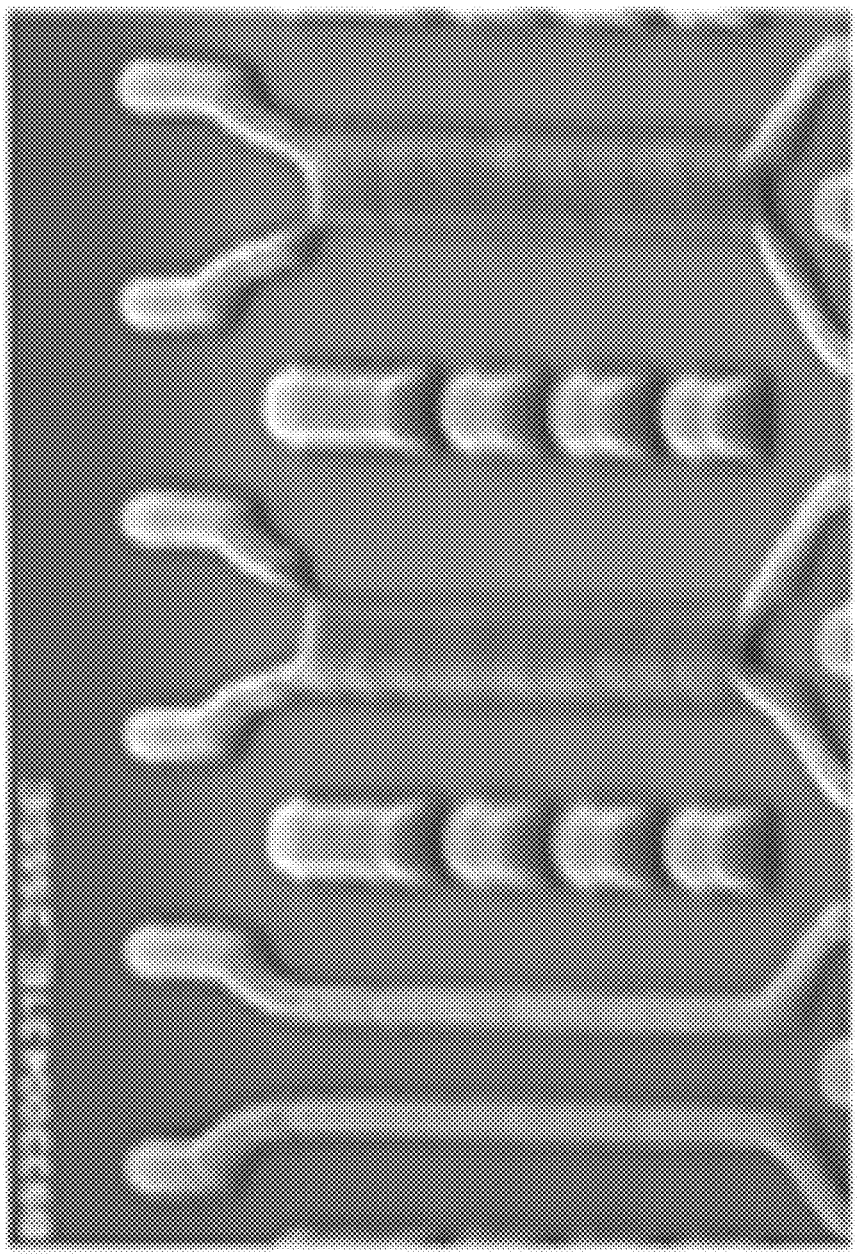
FIG. 8 is an SEM image showing the peripheral patterns of FIG. 7.
Figure 9:
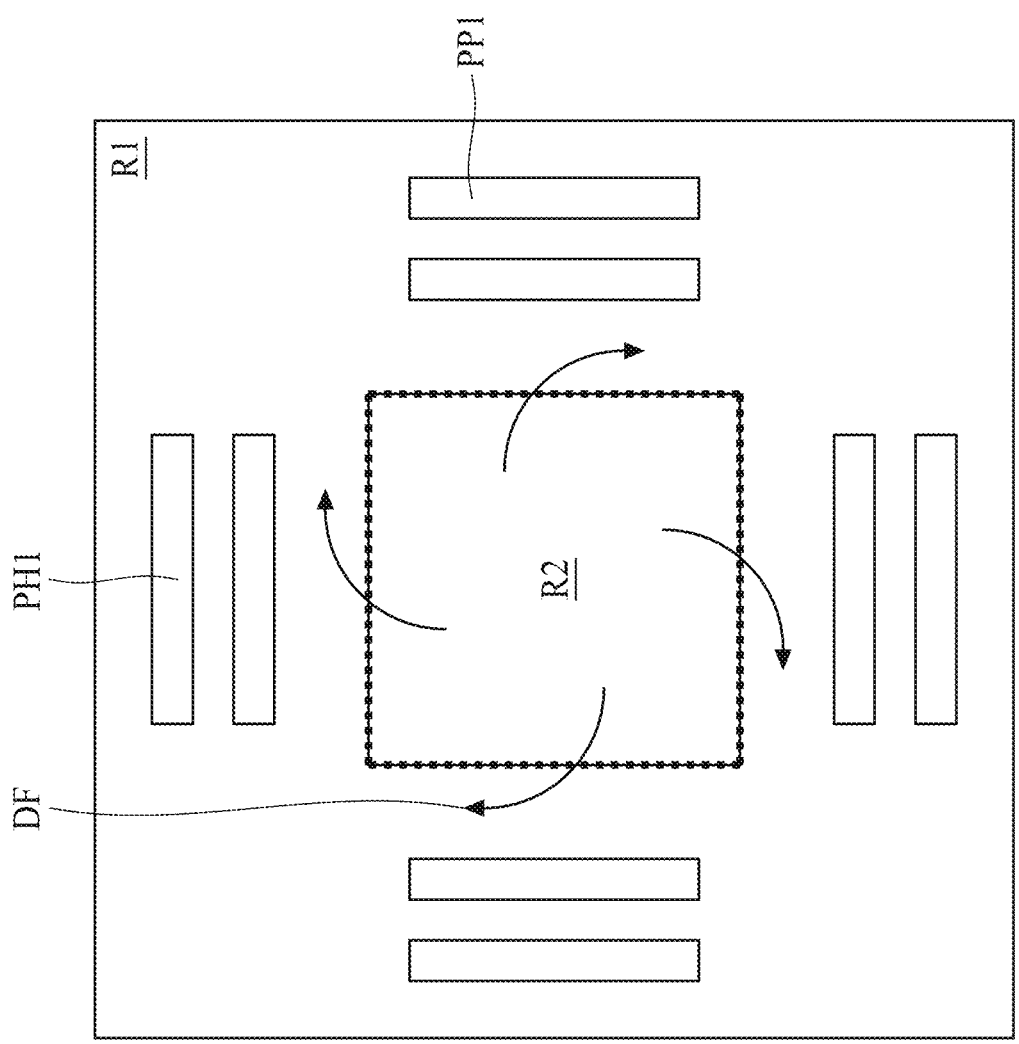
FIG. 9 is an illustrative top view showing a semiconductor structure during a developing process in an intermediate stage of the fabrication of peripheral patterns according to an embodiment of the present disclosure.

FIG. 8 is an SEM image showing a collapse of first photoresist patterns PP1. As can be seen in the image, a portion of the vertical photoresist lines has collapsed. A suspected mechanism for the phenomenon is that, during rinsing, the developing agent may exert an unbalanced force on the first photoresist patterns PP1. FIG. 9 is an illustrative top view showing a developing process in an intermediate stage of the semiconductor structure. The curved arrows represent a flow DF of the developing agent. After the developing agent is deposited onto the wafer, the subsequent rotation drives the developing agent to move across the wafer surface. Normally, the developing agent gradually spreads from the wafer center to the wafer edge during the rotation. Microscopic observation of the region undergoing a developing process reveals that the developing agent flows faster in an open area. Comparing the peripheral region R1 and the array region R2, the latter is free of any impediment because no pattern is formed before or after the developing process. Therefore, when a developing agent with a faster flow DF moves from the array region R2 to the peripheral region R1, a strong unbalanced force is generated. The unbalanced force arises from a developing agent passing from an open region (the array region R2) to a crowded region (the peripheral region R1).

Figure 10:
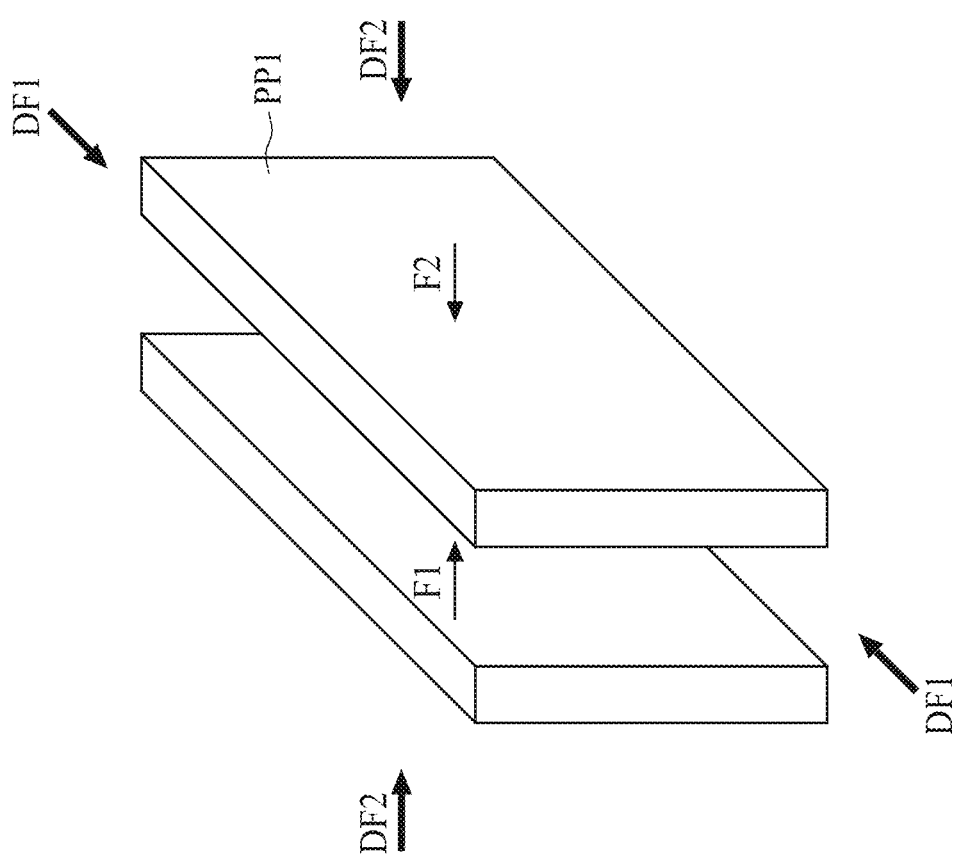
FIG. 10 is an illustrative diagram showing how flow of a developing agent impacts peripheral patterns.

FIG. 10 is an illustrative diagram showing how a developing agent flow impacts first photoresist patterns PP1. When a developing agent DF1 passes through a central channel between two neighboring first photoresist patterns PP1, the interior sidewalls of the first photoresist patterns PP1 are subjected to a capillary force F1. The first photoresist patterns PP1 are pushed outward by the capillary force F1. Similarly, when the developing agent DF2 collides with an exterior sidewall of the first photoresist patterns PP1, the first photoresist patterns PP1 are subjected to a striking force F2. The first photoresist patterns PP1 are pushed inward by the striking force F2. When the strengths of the capillary force F1 and the striking force F2 are not equivalent, the first photoresist patterns PP1 will collapse either in an outward or an inward direction.

In summary, during development, the developing agent moves back and forth between the peripheral region R1 and the array region R2. The developing agent exerts an unbalanced force on the photoresist lines when the wafer undergoes rotation. When the array region R2 in a cell is free of any impediment, the unbalanced force is increased, and therefore causes the instability of the first photoresist patterns PP1, leading to their collapse.

The above first and second comparative embodiments suffer from different problems and cannot be used to fabricate robust patterns. Therefore, a trade-off solution comes from the two comparative embodiments and can effectively solve the technical problem. According to various designs of photo mask layout and their corresponding experiments, a suitable pattern in the array region R2 in the first lithography stage (PH1) formed during the peripheral region process is disclosed.

Figure 11:
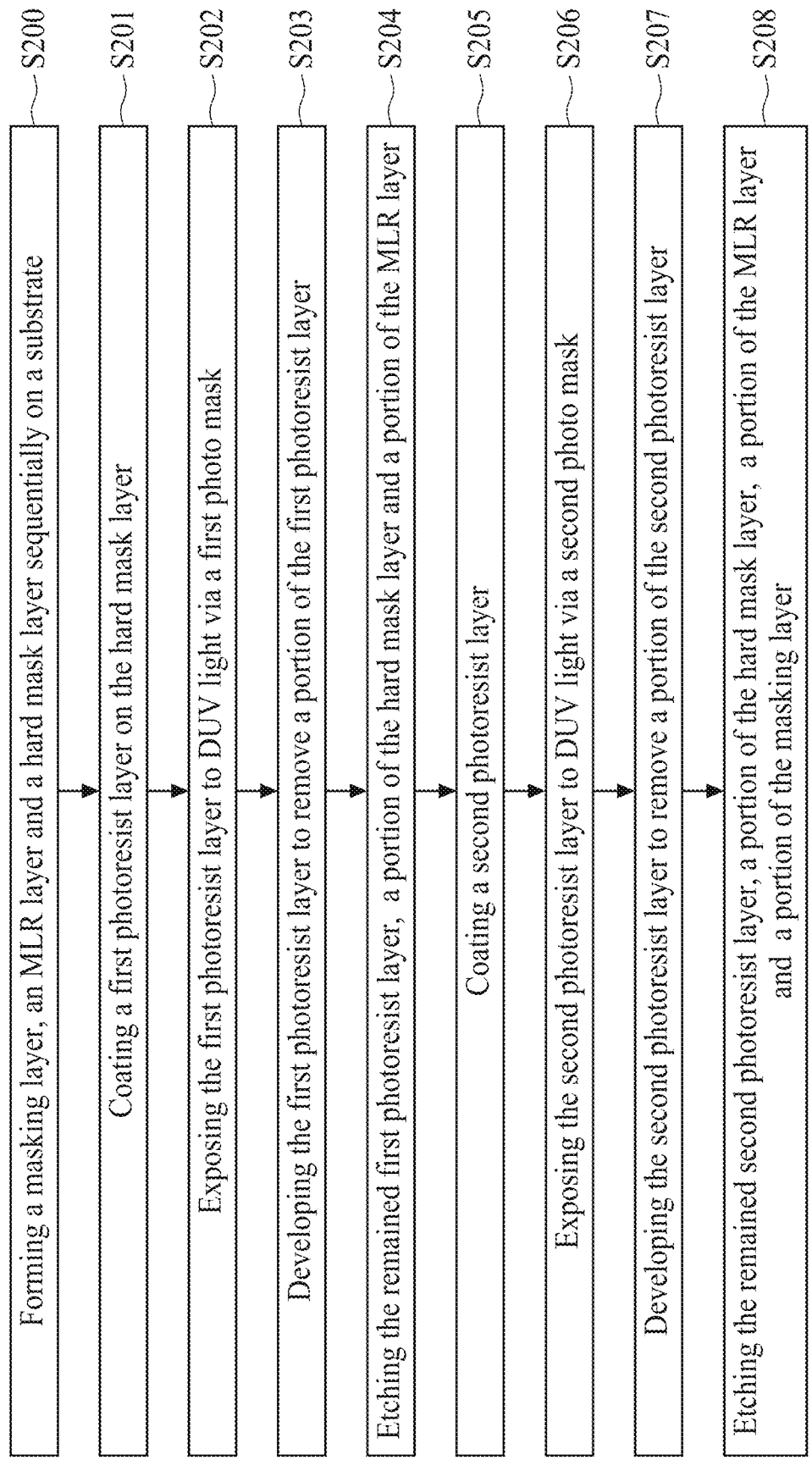
FIG. 11 is flow diagram illustrating a peripheral region process for fabricating a semiconductor structure according to an embodiment of the present disclosure.

FIG. 11 is a flow diagram illustrating a peripheral region process 20 for fabricating a semiconductor structure according to one embodiment of the present disclosure. In step S200, multiple layers are formed on a substrate 100. In some embodiments, the substrate 100 includes a metal layer. A masking layer 102 is then deposited on the substrate 100. In some embodiments, the masking layer 102 includes a nitride layer. A MLR layer 104 is then deposited on the masking layer 102. Subsequently, a hard mask layer 106 is formed on the MLR layer 104. With reference to step S201 of the peripheral region process 20 in FIG. 11, a first photoresist layer 108 is deposited on the hard mask layer 106.

Figure 12:
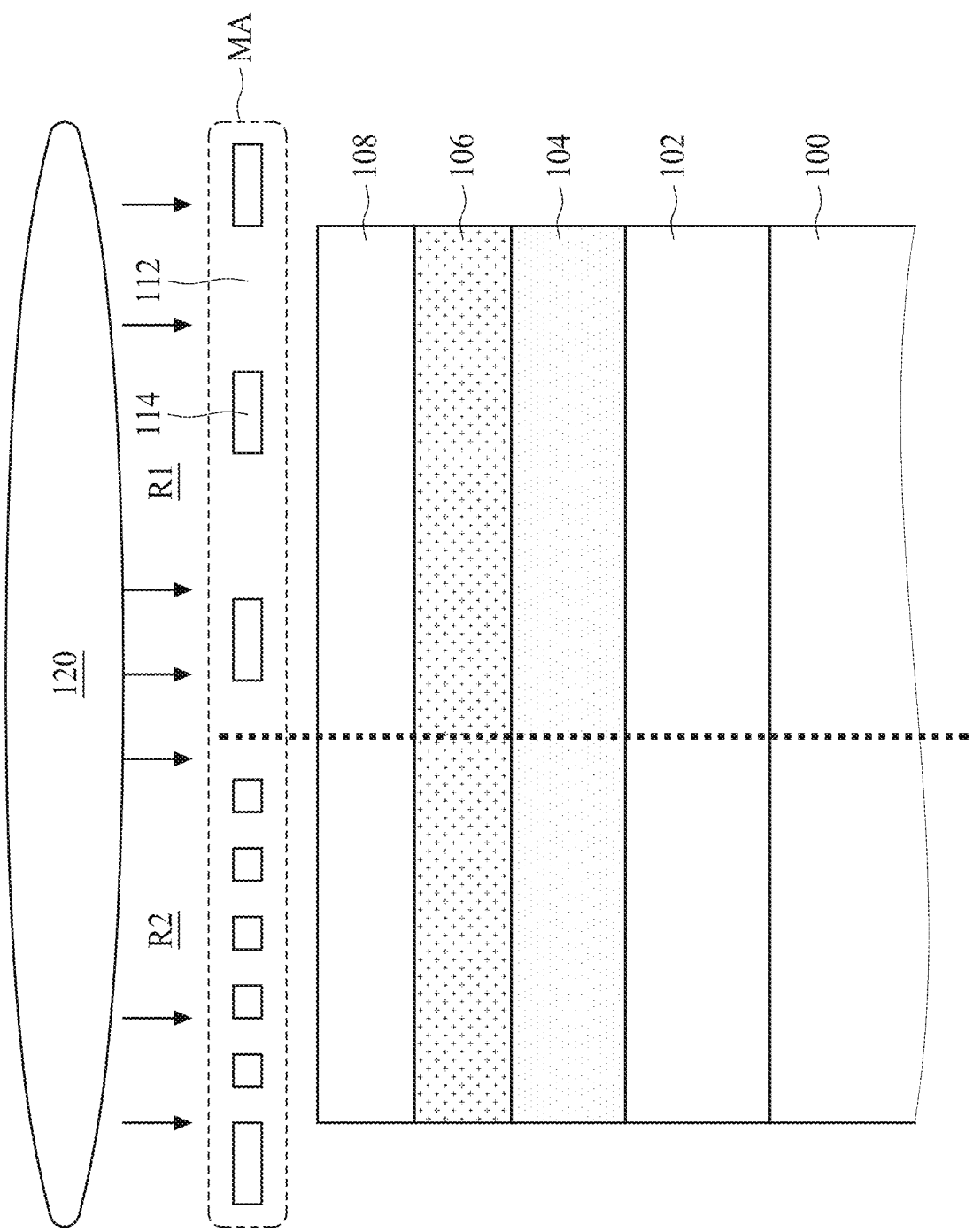
FIG. 12 is a schematic cross-sectional view showing a semiconductor structure during a first exposure step in the peripheral region process according to an embodiment of the present disclosure.

FIG. 12 illustrates a schematic cross-sectional view of a first exposure step in the peripheral region process 20. With reference to FIG. 12 and step S202 of the method 20 in FIG. 11, a first photo mask MA with a first transparent portion 112 and a first opaque portion 114 is used. The first photoresist layer 108 is exposed to a deep ultraviolet (DUV) light 120. In some embodiments, the first photo mask MA is used to make specific photoresist patterns in the array region R2 while the peripheral region process 20 is being performed.

In some embodiments, the photo mask MA is only applied in the first lithography stage (PH1).

Figure 13:
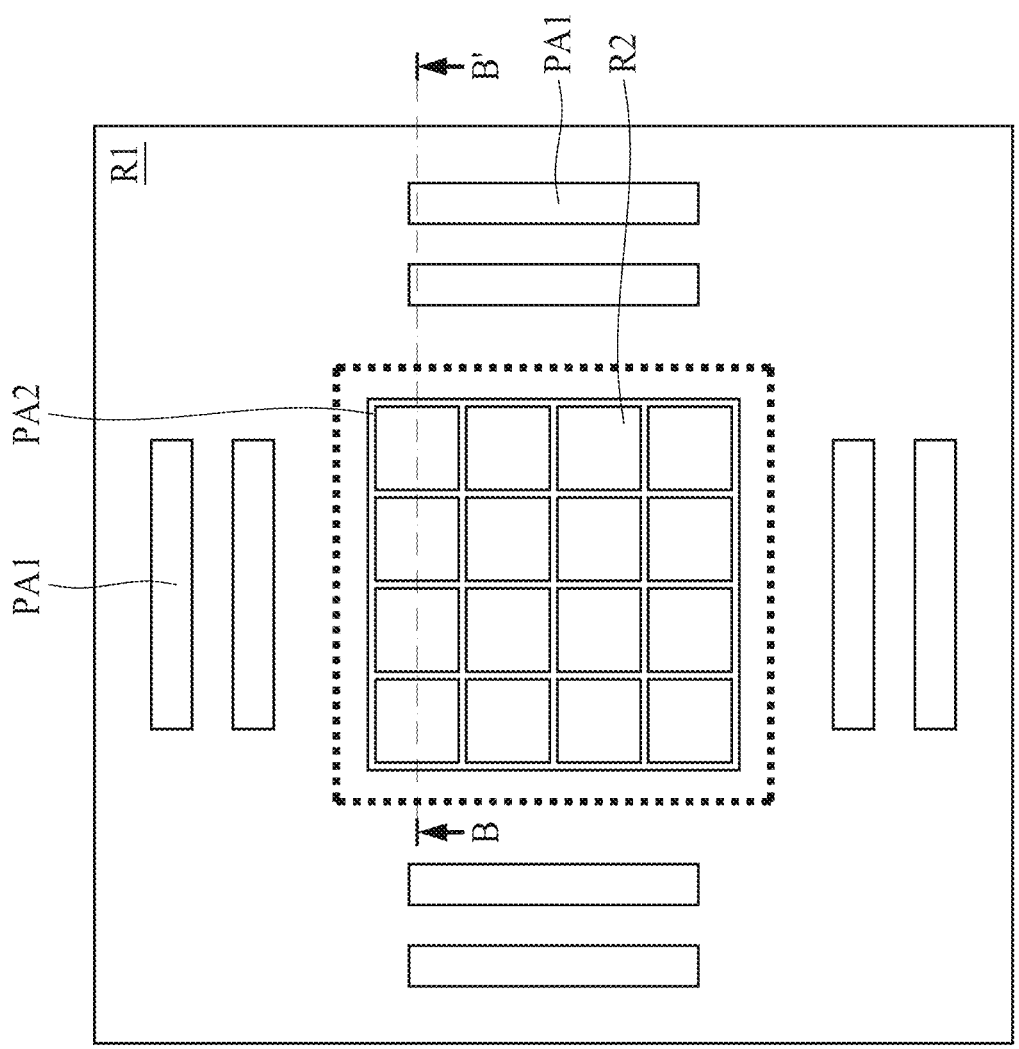
FIG. 13 is an illustrative top view showing a semiconductor structure during a first developing step in the peripheral region process according to an embodiment of the present disclosure.
Figure 14:
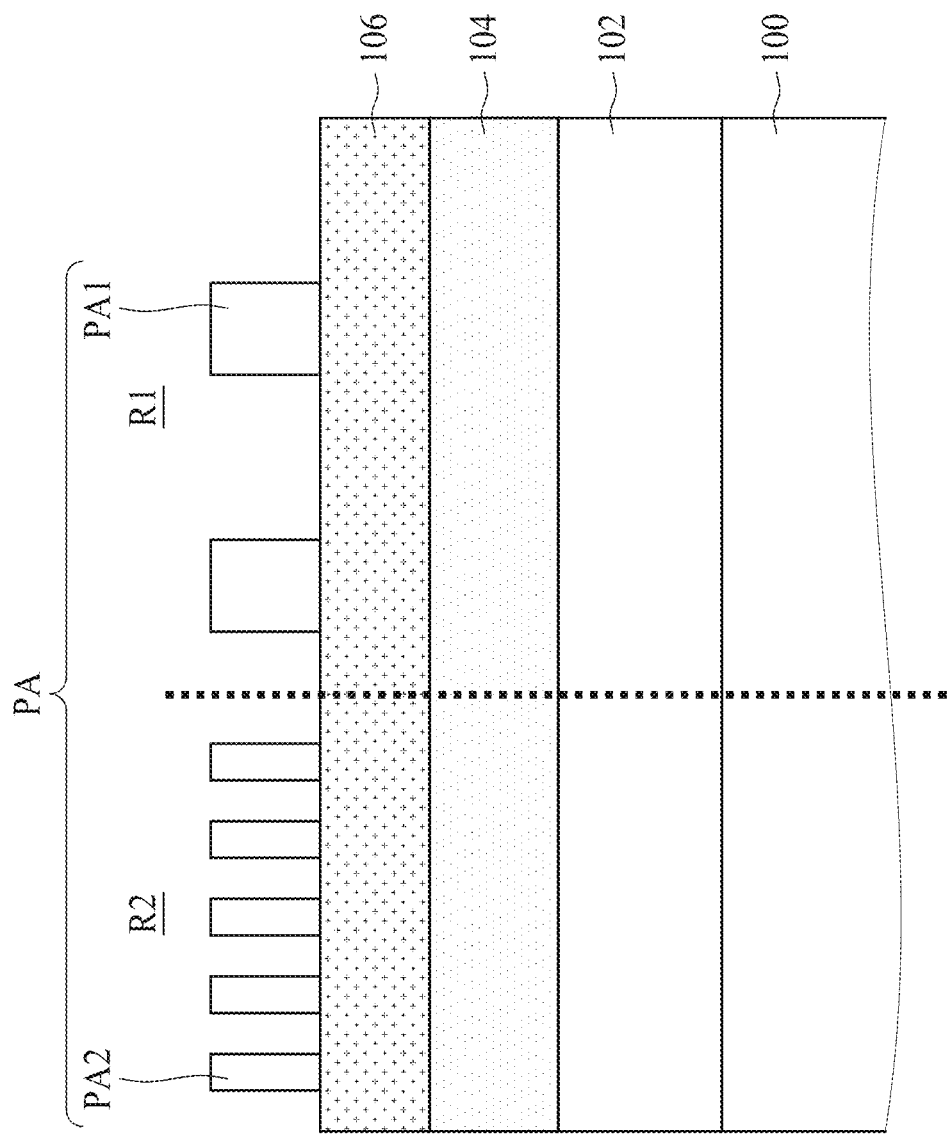
FIG. 14 is a schematic cross-sectional view of the semiconductor structure of FIG. 13 according to a first comparative embodiment.

With reference to FIG. 13 and FIG. 14, FIG. 14 is a schematic cross-sectional view showing a first developing step in the peripheral region process 20 along a horizontal dashed line B-B' in FIG. 13. The rectangular dashed line in FIG. 13 is equivalent to the vertical dashed line in FIG. 14, and separates the peripheral region R1 from the array region R2. With reference to FIG. 13, after step S203 of the process 20 in FIG. 11 is performed, a first pattern PA is formed. The first pattern PA includes first peripheral patterns PA1 and first array patterns PA2, which are separately located in the peripheral region R1 and the array region R2, respectively. According to an embodiment, the first array patterns PA2 are formed in a grid-shaped structure, but are not limited thereto.

In some embodiments, according to the design of the photo mask layout, the first array patterns PA2 can have different pattern densities. The varied photoresist pattern densities in the array region R2 have the advantage of reducing the amount of photoresist remaining in the array region R2 before the subsequent etch process is performed. The purpose of decreasing the usage of photoresist is to avoid photoresist remaining after the completion of the double patterning of the peripheral region R1. In addition, the first array patterns PA2 serve as an impediment, which provides a rough surface in the array region R2. When the developing agent encounters a rough surface in the array region R2, the mechanism for developing agents impacting on the photoresist lines is changed. The rough surface can reduce the flow rate of developing agents when the wafer is rotated during the development. When the flow rate of developing agents is decreased, the capillary force received by first peripheral patterns PA1 is also decreased. Therefore, the first peripheral patterns PA1 can be robustly formed in the peripheral region R1. The arrangement of the first array patterns PA2 represents a compromise between no coverage and full coverage of photoresist in the array region R2. Such technical feature can solve both the photoresist-remaining problem and the pattern-collapsing problem.

In some embodiments, the first peripheral patterns PA1 and the first array patterns PA2 serve different functions in the first lithography stage (PH1) which includes the steps S201 to S203. The first peripheral patterns PA1 are used to define circuit patterns that are to be transferred during the final stage of the peripheral region process 20. However, the first array patterns PA2 are not intended to define profiles into the layers below. In some embodiments, the first array patterns PA2 are used to reduce the flow rate of developing agents. The first array patterns PA2 assist in the formation of robust first peripheral patterns PA1, and are not intended for pattern definition.

Figure 15:
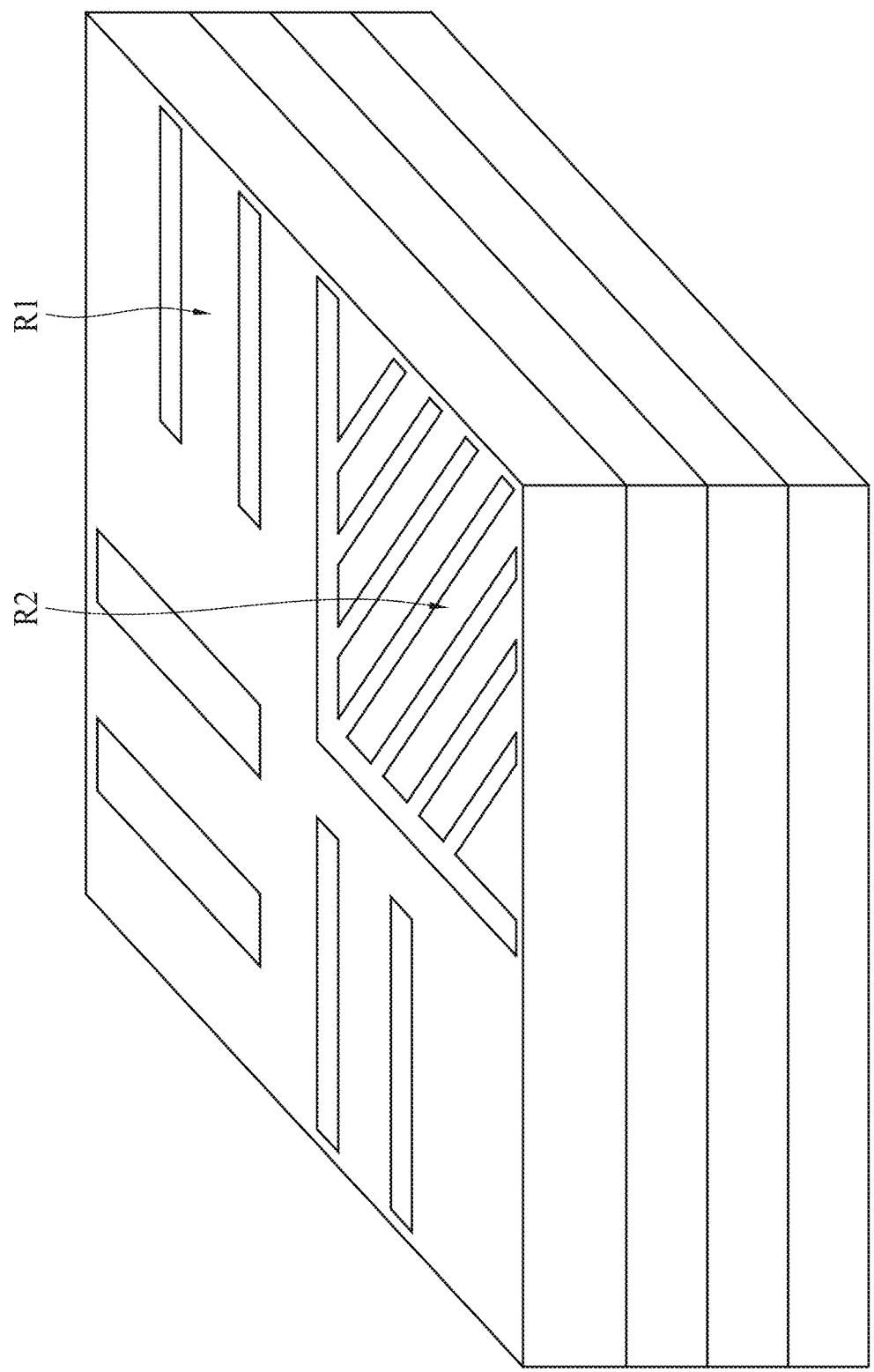
FIG. 15 is an illustrative perspective view of a semiconductor structure after the first lithography stage is completed according to an embodiment of the present disclosure.

FIG. 15 is an illustrative perspective view diagram of the semiconductor structure after the first lithography stage (PH1), including the steps S201 to S203 shown in FIG. 11, is completed. One quarter of the semiconductor structure is the array region R2 and the other three quarters belong to the peripheral region R1. Referring to FIGS. 14 and 15, the first peripheral patterns PA1 and first array patterns PA2 are located in the peripheral region R1 and the array region R2, respectively, on the same hard mask layer 106. However, the two kinds of patterns serve different functions in the first lithography stage (PH1). First peripheral patterns PA1 are used to define circuit patterns that are to be transferred during the final stage of the peripheral region process 20. In contrast, first array patterns PA2 are not intended to define profiles into the layers below. In some embodiments, the first array patterns PA2 are used to reduce the flow rate of developing agents. The first array patterns PA2 assist in the formation of robust first peripheral patterns PA1, and are not intended for pattern definition.

Figure 16:
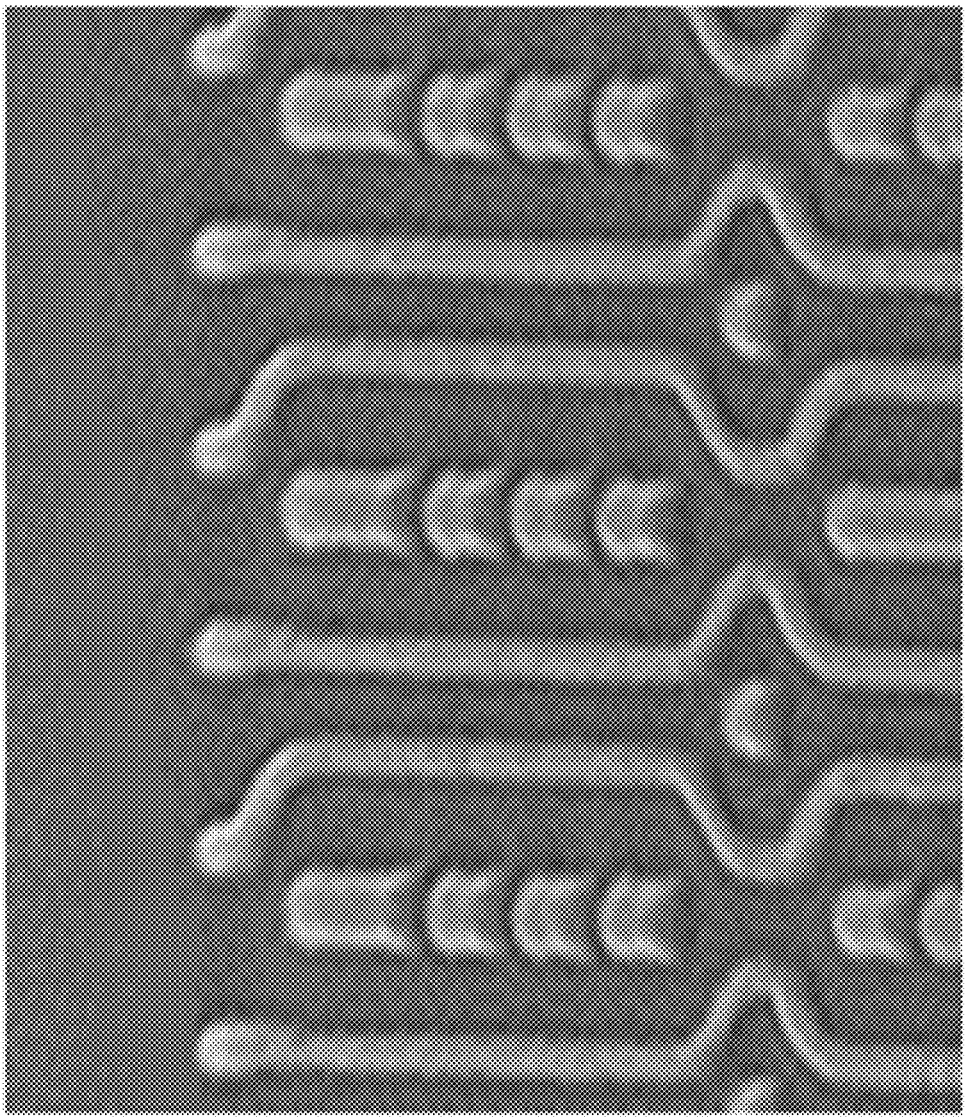
FIG. 16 is an SEM image showing robustly-formed first peripheral patterns according to an embodiment of the present disclosure.

FIG. 16 is an SEM image showing robustly-formed first peripheral patterns PAL The photoresist patterns in the peripheral region R1 do not collapse after the wafer undergoes development.

Figure 17:
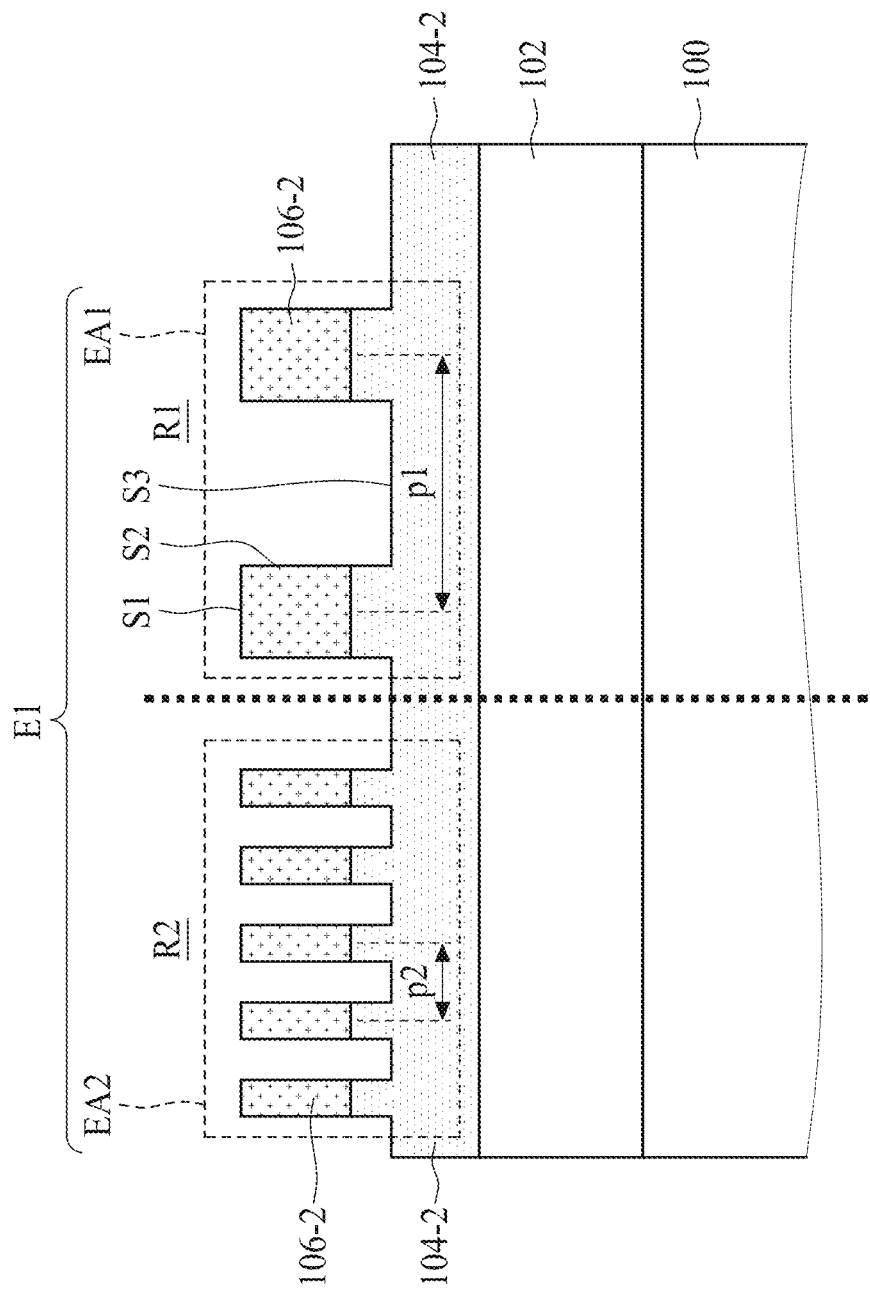
FIG. 17 is a schematic cross-sectional view of the semiconductor structure showing a first etching process during the peripheral region process according to an embodiment of the present disclosure.

FIG. 17 is a schematic cross-sectional view showing a first etching process in the peripheral region process 20. In step S204 of the method 20 in FIG. 11, the first etch process consumes portions of the hard mask layer 106 and portions of the MLR layer 104, which are not protected by the first pattern PA. In some embodiments, portions of the MLR layer 104 are etched to a predetermined depth, which produces multiple recesses in the MLR layer 104. As a result, a remaining etched hard mask layer 106-2 and a remaining etched MLR layer 104-2 are left.

Still referring to FIG. 17, after the first pattern PA is removed, a first etched pattern E1, which includes the etched hard mask layer 106-2 and the etched MLR layer 104-2, is formed. In addition, the first etched pattern E1 includes a first etched peripheral pattern EA1 and a first etched array pattern EA2, which are located respectively in the peripheral region R1 and the array region R2. In some embodiments, a first pitch p1 of the first etched peripheral pattern EA1 is different from a second pitch p2 of the first etched array pattern EA2. In some embodiments, the first etched pattern E1 has a top surface S1, a sidewall S2 and a bottom surface S3, wherein the sidewall S2 connects the top surface S1 to the bottom surface S3. The top surface S1 is a portion of the etched hard mask layer 106-2. The sidewall S2 includes a portion of the etched hard mask layer 106-2 and a portion of the etched MLR layer 104-2. The bottom surface S3 is a portion of the etched MLR layer 104-2.

Figure 18:
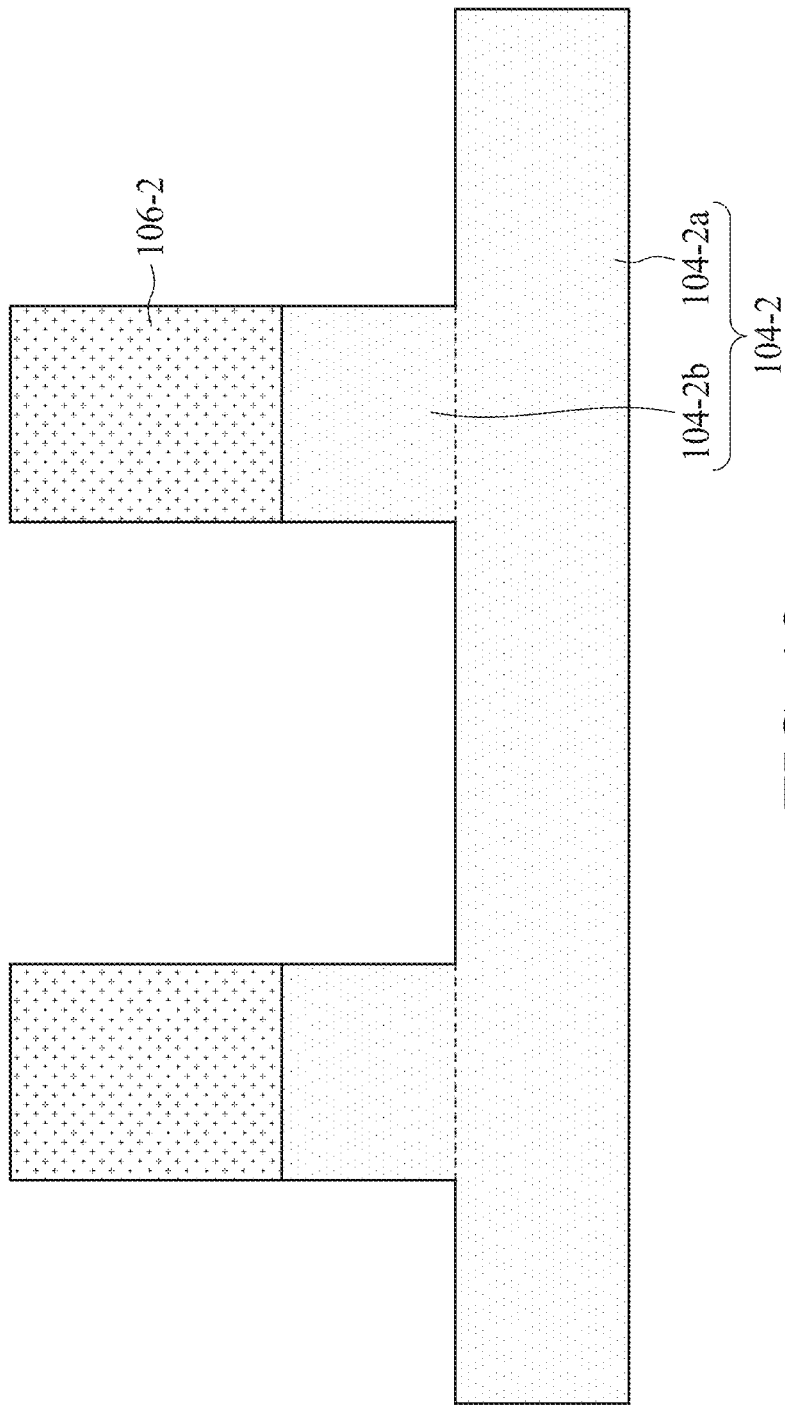
FIG. 18 is an enlarged view of the semiconductor structure including the first etched pattern of FIG. 17 according to an embodiment of the present disclosure.

FIG. 18 is an enlarged view of the first etched peripheral pattern EA1 in FIG. 17. As can be seen, the etched MLR layer 104-2 includes a horizontal MLR portion 104-2a and a vertical MLR portion 104-2b. The horizontal MLR portion 104-2a is located on the masking layer 102, as shown in FIG. 17. The vertical MLR portion 104-2b is interposed between the horizontal MLR portion 104-2a and the etched hard mask layer 106-2, as shown in FIG. 18.

Figure 19:
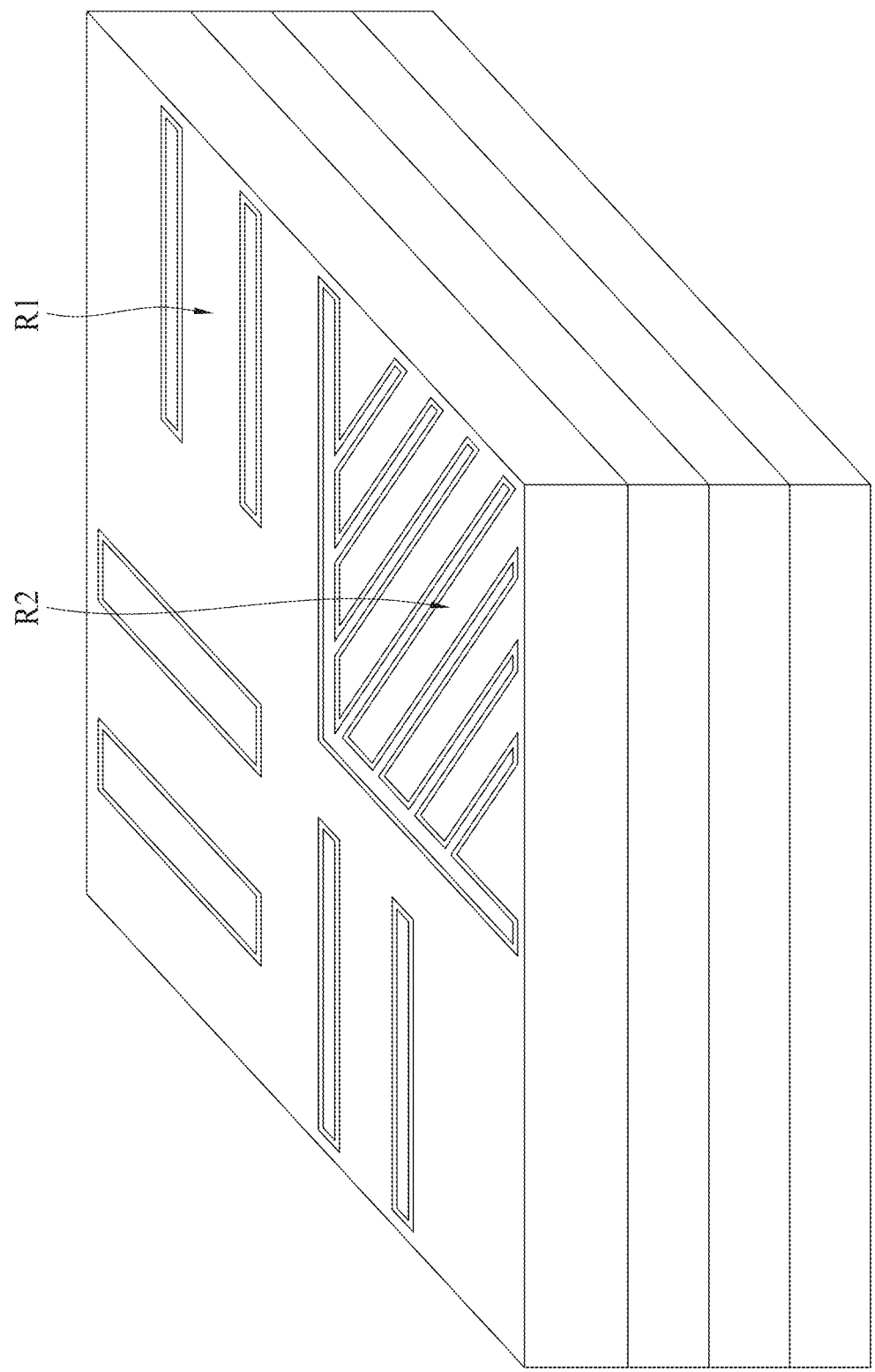
FIG. 19 is an illustrative perspective view diagram of the semiconductor structure after completion of the first etch stage according to an embodiment of the present disclosure.

FIG. 19 is an illustrative perspective view diagram after the first etch stage (ET1) is completed. FIG. 19 shows the first litho-etch stage (PH1 and ET1) in the patterning of the peripheral region R1 as completed. The exposed top surface in the diagram is the top surface of the etched hard mask layer 106-2.

Figure 20:
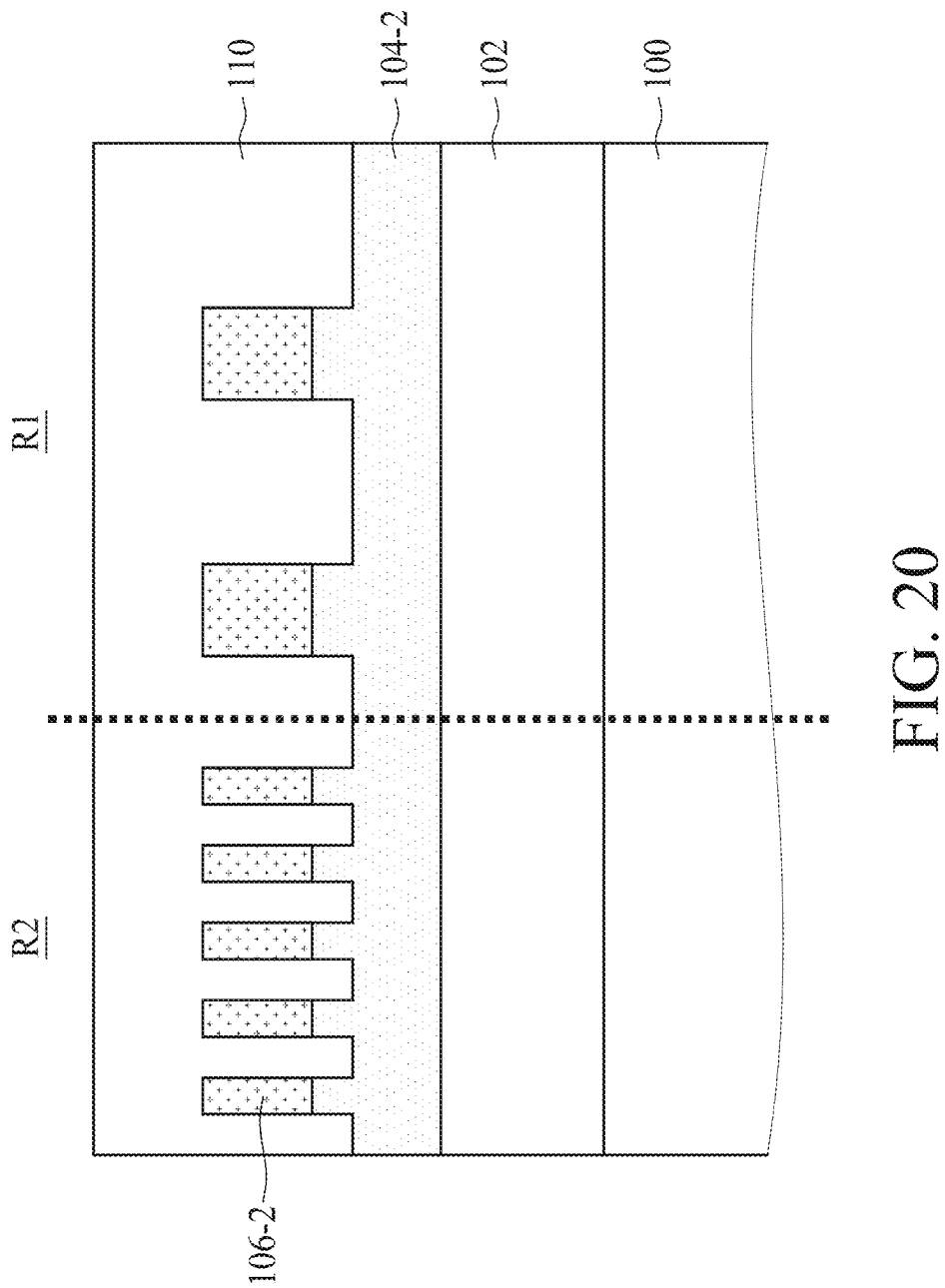
FIG. 20 is a schematic cross-sectional view of the semiconductor structure showing a coating step in the peripheral region process according to an embodiment of the present disclosure.

FIG. 20 is a schematic cross-sectional view showing a second coating step in the peripheral region process 20. In step S205 of the method 20 in FIG. 11, a second photoresist layer 110 is deposited on the etched MLR layer 104-2 and etched hard mask layer 106-2. In some embodiments, the first peripheral patterns PA1, shown in FIG. 14, are stripped before the deposition of the second photoresist layer 110. In alternative embodiments, the first peripheral patterns PA1 may be remained before the deposition of the second photoresist layer 110.

Figure 21:
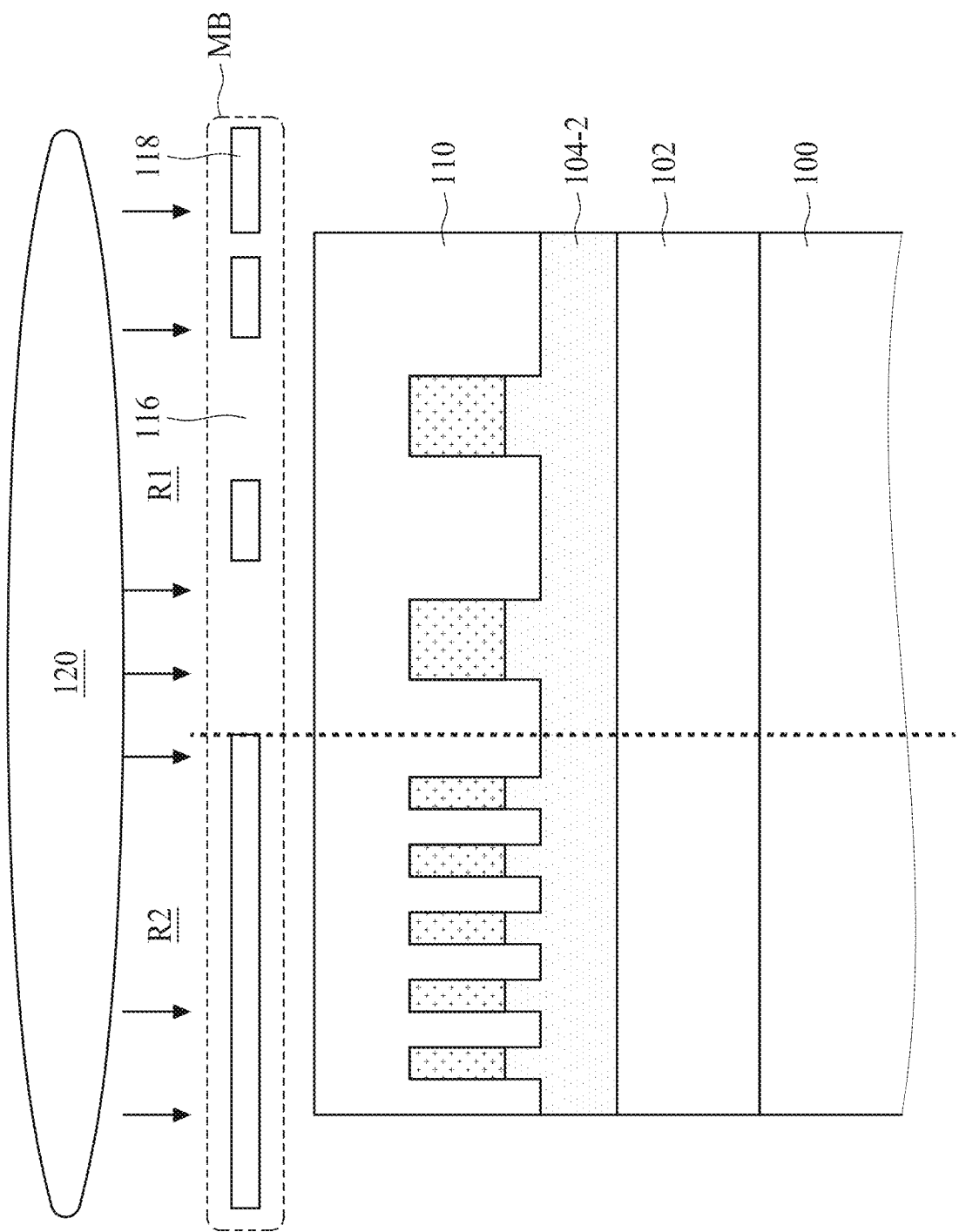
FIG. 21 is a schematic cross-sectional view of the semiconductor structure showing a second exposure step in the peripheral region process according to an embodiment of the present disclosure.

Please refer to step S206 in FIG. 11 and FIG. 21. FIG. 21 is a schematic cross-sectional view showing a second exposure step in the peripheral region process 20. The second photoresist layer 110 is subjected to a second exposure of DUV light 120 using a second photo mask MB. The second photo mask MB includes a second transparent portion 116 and a second opaque portion 118. It should be noted that the second photo mask MB serves to define patterns of peripheral circuits. Therefore, in some embodiments, the arrangement of the second transparent portion 116 and the second opaque portion 118 corresponds only to the peripheral region R1.

Figure 22:
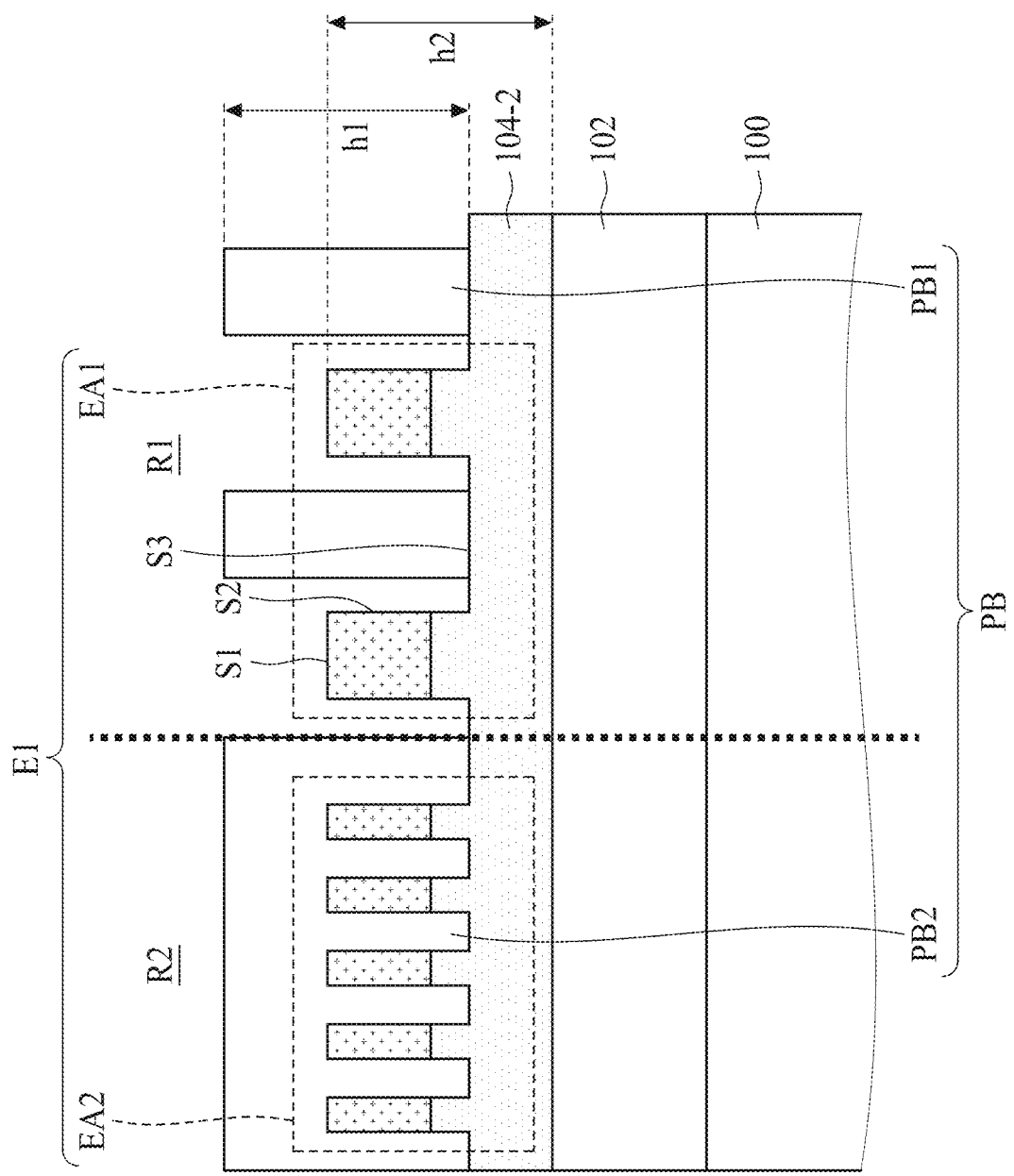
FIG. 22 is a schematic cross-sectional view of the semiconductor structure showing a second developing step in the peripheral region process according to an embodiment of the present disclosure.

FIG. 22 is a schematic cross-sectional view showing a second developing step in the peripheral region process 20. In step S207 in FIG. 11, the exposed second photoresist layer 110 is developed, and then a second pattern PB is formed. The second pattern PB includes second peripheral patterns PB1 and second array patterns PB2, which are separately located in the peripheral region R1 and the array region R2, respectively. At this stage, the first etched peripheral pattern EA1 originally covered by the second photoresist layer 110 is partially exposed. In some embodiments, a first height h1 of the second peripheral pattern PB1 is greater than a second height h2 of the first etched peripheral pattern EA1. More specifically, in the peripheral region R1, the second peripheral pattern PB1 is formed on the bottom surface S3 and separated from the sidewall S2 of the first etched peripheral pattern EA1. In the array region R2, the second array pattern PB2 completely covers the top surface S1 and the bottom surface S3 of the first etched array pattern EA2.

Figure 23:
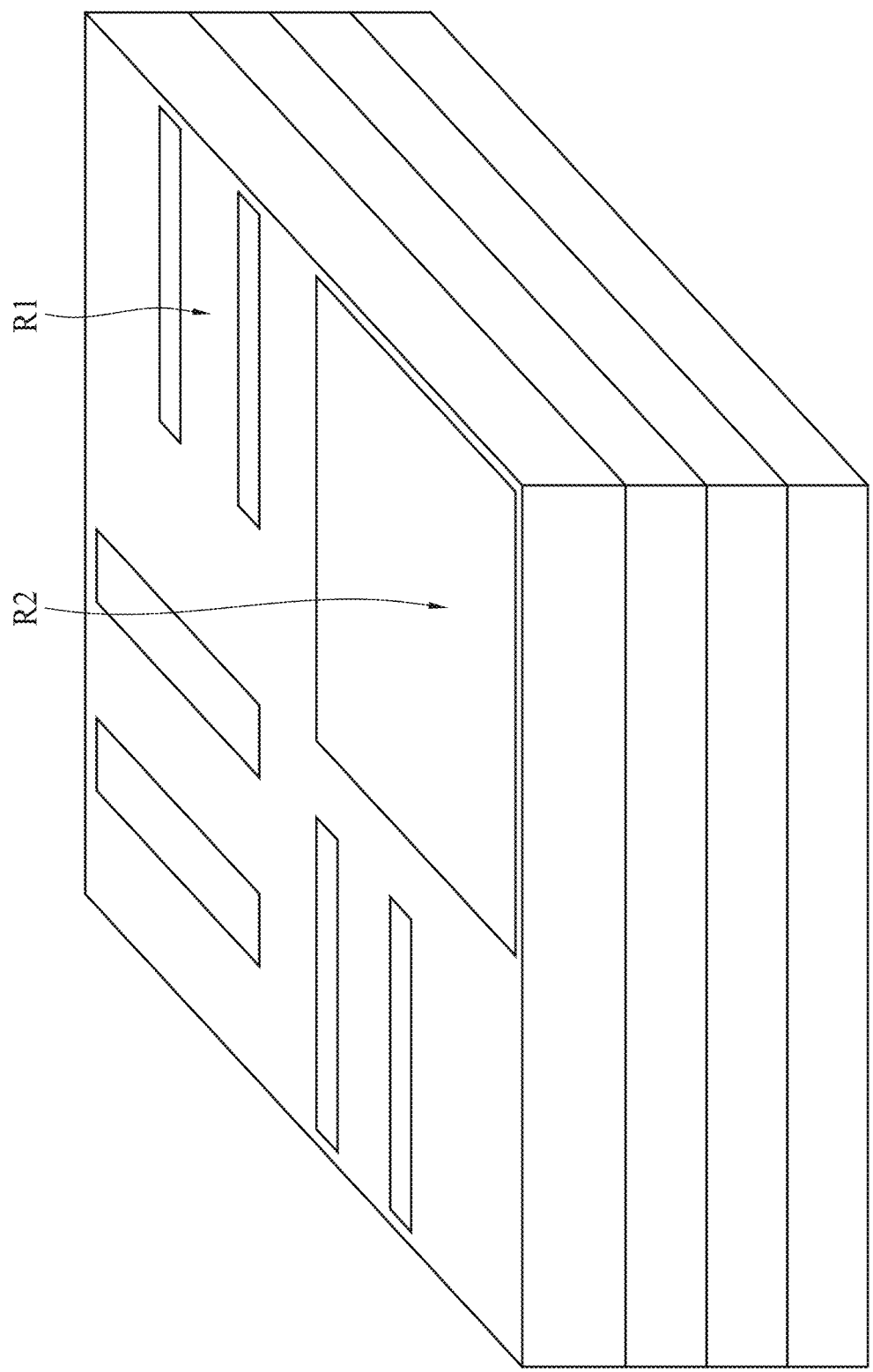
FIG. 23 is an illustrative perspective view diagram showing the semiconductor structure after a second lithography stage is completed according to an embodiment of the present disclosure.

FIG. 23 is an illustrative perspective view diagram of the semiconductor structure after the second lithography stage (PH2), including the steps S205 to S207 shown in FIG. 11, is completed. It should be noted that the second peripheral patterns PB1 have spaced photoresist lines, while the second array pattern PB2 is a full coverage of photoresist on the first etched pattern E1.

Figure 24:
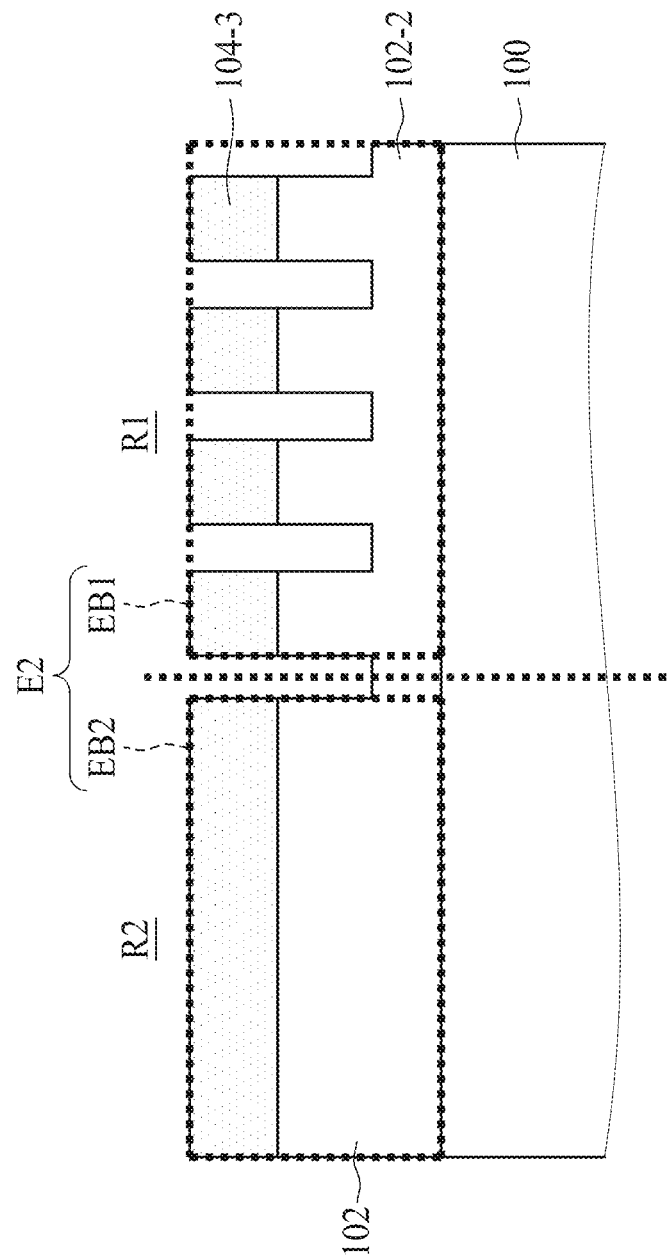
FIG. 24 is a schematic cross-sectional view of the semiconductor structure showing a second etching process in the peripheral region process according to an embodiment of the present disclosure.

FIG. 24 is a schematic cross-sectional view showing a second etching process in the peripheral region process 20. Please refer to step S208 in FIG. 11 and FIGS. 22 and 24. In the second etching process, the masking layer 102 is etched using the first etched pattern E1 and the second pattern PB, shown in FIG. 21, as an etching mask. After the remaining photoresist is stripped, a second etched pattern E2 is formed. The second etched pattern E2 includes a second etched peripheral pattern EB1 and a second etched array pattern EB2. The second etched peripheral pattern EB1 and the second etched array pattern EB2 are located in the peripheral region R1 and the array region R2, respectively. The second etched peripheral pattern EB1 includes an etched MLR layer 104-3 and an etched masking layer 102-2. Specifically, the formation of the etched masking layer 102-2 is performed using the first etched peripheral pattern EA1 and the second peripheral pattern PB1, shown in FIG. 22, as an etching mask. However, the second etched array pattern EB2 does not contain any patterned masking layer 102 because the array region was completely covered by photoresist, that is, the second array pattern PB2 in the second etching process. Therefore, the second litho-etch stage (PH2 and ET2) in the patterning of the peripheral region is completed. It should be noted that in the peripheral region R1, the second etched pattern E2 has the etched masking layer 102-2, that is, the masking layer 102 in the peripheral region R1 is patterned. However, in the array region R2, the masking layer 102 is not patterned at all.

Figure 25:
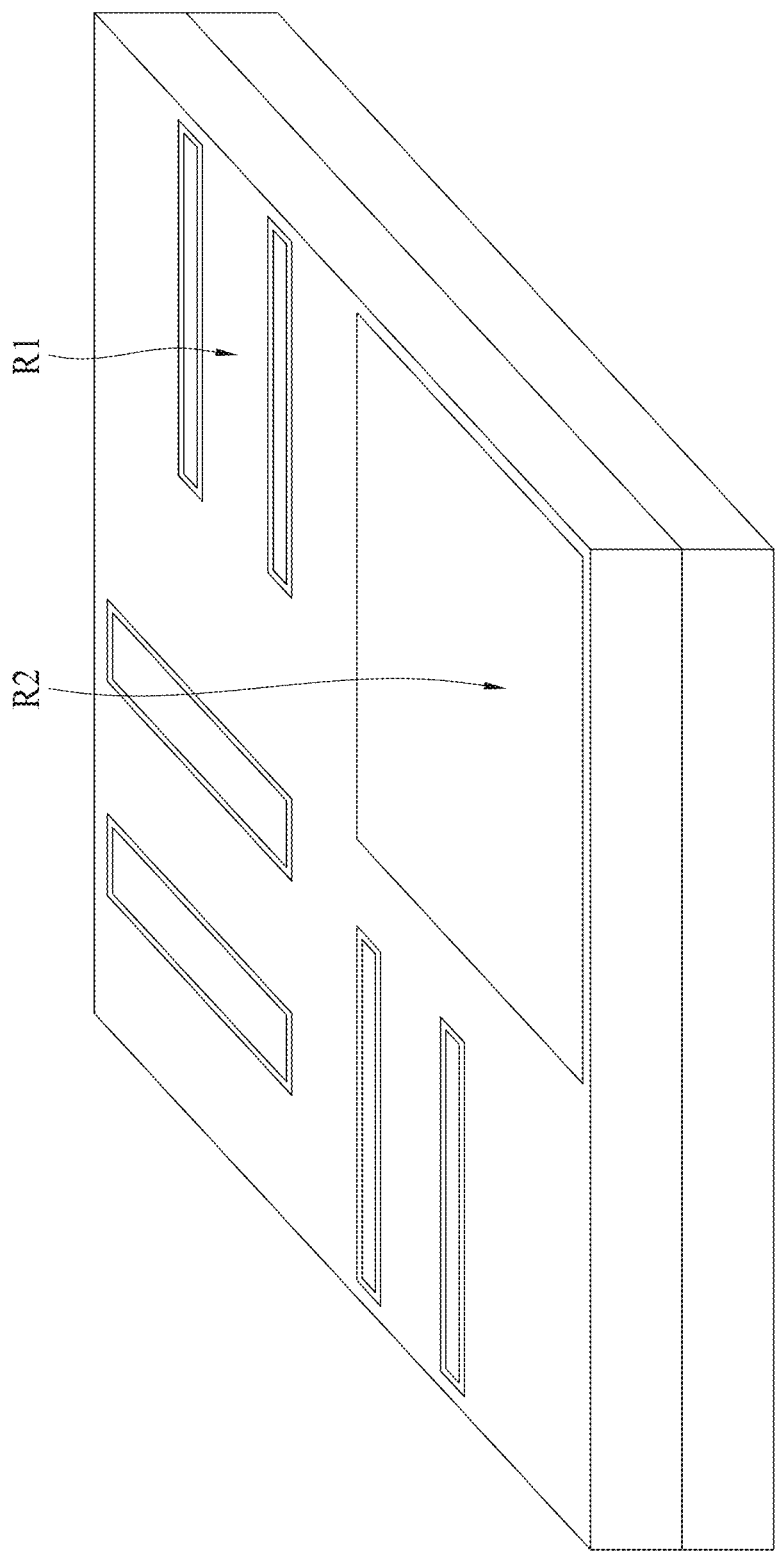
FIG. 25 is an illustrative perspective view diagram of the semiconductor structure after the second etch stage is completed according to an embodiment of the present disclosure.

FIG. 25 is an illustrative perspective view diagram of the semiconductor structure after the second etch stage (ET2) is completed. The peripheral region R1 has been formed by a series of patterning processes, whereas the pattern initially defined in the first lithography stage (PH1) in the array region R2 is not transferred to the masking layer 102. Therefore, in the array region R2, the MLR layer 104 and the masking layer 102 have no photoresist patterns. On the metal zero layer, the array region process begins after the peripheral region process 20 is finished.

In some embodiments, the peripheral region R1 has been formed by a series of patterning processes, whereas the pattern initially defined in the first lithography stage (PH1) in the array region R2 is not transferred to the masking layer 102. Therefore, in the array region R2, the MLR layer 104 and the masking layer 102 have no photoresist patterns. On the metal zero layer, the array region process begins after the peripheral region process 20 is finished.

The embodiments according to the invention disclose a double patterning technology to define peripheral patterns in a DRAM cell. Due to the consideration of line width, the peripheral pattern lines need to undergo two lithographic processes and two etch processes. The adding of photoresist patterns in the array region R2 while fabricating peripheral patterns on the M0 layer can increase the stability of peripheral pattern lines. Therefore, peripheral patterns are strengthened and are able to resist the rinse of developing agents. Peripheral pattern lines will not collapse after being subjected to the rinse of the developing agent. Moreover, the photoresist coverage of patterns in the array region is not excessive, so the loading effect is reduced during etch processes and, at the same time, the occurrence of photoresist residues is avoided.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or step.

What is claimed is:
1. A method for fabricating a semiconductor structure, comprising:
  providing a substrate;
  forming a masking layer on the substrate, the masking layer including a peripheral region and an array region adjacent to the peripheral region;
  forming a first etched peripheral pattern in the peripheral region and a first etched array pattern in the array region, wherein the first etched peripheral pattern and the first etched array pattern have a top surface, a sidewall and a bottom surface, the sidewall connecting the top surface to the bottom surface, wherein the first etched peripheral pattern is configured by the steps of:
    configuring the top surface of the first etched peripheral pattern to have a portion of an etched hard mask layer;
    configuring the sidewall of the first etched peripheral pattern to have a portion of the etched hard mask layer and a portion of an etched multilayer resist (MLR) layer; and configuring the bottom surface of the first etched peripheral pattern to have a portion of the etched MLR layer;

forming a second peripheral pattern in the peripheral region by the steps of:

depositing the second peripheral pattern on the etched MLR layer at the bottom surface of the first etched peripheral pattern;

in the peripheral region, separating the second peripheral pattern from the sidewall of the first etched peripheral pattern, such that the second peripheral pattern is with no contact with the sidewall of the first etched peripheral pattern; and forming a second array pattern in the array region by the steps of:

directly depositing the second array pattern on the bottom surface of the first etched array pattern; and in the array region, completely covering the top surface and the bottom surface of the first etched array pattern by the second array pattern; and etching the masking layer using the first etched peripheral pattern and the second peripheral pattern as an etching mask to form an etched masking layer in the peripheral region.

2. The method according to claim 1, wherein the substrate comprises a metal layer.

3. The method according to claim 1, wherein the masking layer comprises a nitride layer.

4. The method according to claim 1, wherein a first pitch of the first etched peripheral pattern is different from a second pitch of the first etched array pattern.

5. The method according to claim 1, wherein a first height of the second peripheral pattern is greater than a second height of the first etched peripheral pattern.

6. The method according to claim 1, wherein the forming the first etched peripheral pattern and the first etched array pattern includes:

forming a first photoresist layer on the masking layer; and exposing the first photoresist layer to ultraviolet radiation via a first photo mask, wherein the first photo mask comprises a first transparent portion and a first opaque portion corresponding to the first etched peripheral pattern and the first etched array pattern.

7. The method according to claim 6, wherein after the first photoresist layer is exposed to ultraviolet radiation, a developing process is performed to form a first pattern.

8. The method according to claim 7, wherein the first pattern comprises a first peripheral pattern in the peripheral region and a first array pattern in the array region.

9. The method according to claim 7, wherein after the developing process is performed, an etching process is performed using the first pattern as an etching mask to form the first etched peripheral pattern and the first etched array pattern.

10. The method according to claim 1, wherein the forming the second peripheral pattern and the second array pattern includes:

forming a second photoresist layer on the first etched peripheral pattern and on the first etched array pattern; and exposing the second photoresist layer to ultraviolet radiation via a second photo mask, wherein the second photo mask comprises a second transparent portion and a second opaque portion corresponding to the second peripheral pattern.

11. The method according to claim 10, wherein after the second photoresist layer is exposed to ultraviolet radiation, a developing process is performed to form the second peripheral pattern and the second array pattern.

12. The method according to claim 10, wherein the forming the second photoresist layer includes covering the first etched peripheral pattern and the first etched array pattern with the second photoresist layer.

13. The method according to claim 12, wherein the second peripheral pattern is formed on the bottom surface and separated from the sidewall of the first etched peripheral pattern in the peripheral region.

14. The method according to claim 12, wherein the second array pattern covers the top surface and the bottom surface of the first etched array pattern in the array region.

* * * * *